United States Patent
Lee et al.

(10) Patent No.: US 11,980,034 B2
(45) Date of Patent: May 7, 2024

(54) MEMORY DEVICE AND MANUFACTURING METHOD OF THE MEMORY DEVICE

(71) Applicant: SK hynix Inc., Icheon-si (KR)

(72) Inventors: Dong Hun Lee, Icheon-si (KR); Jung Shik Jang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 349 days.

(21) Appl. No.: 17/320,813

(22) Filed: May 14, 2021

(65) Prior Publication Data
US 2022/0149065 A1 May 12, 2022

(30) Foreign Application Priority Data
Nov. 11, 2020 (KR) .......................... 10-2020-0150234

(51) Int. Cl.
| H10B 43/27 | (2023.01) |
| H10B 41/10 | (2023.01) |
| H10B 41/27 | (2023.01) |
| H10B 41/40 | (2023.01) |
| H10B 43/10 | (2023.01) |
| H10B 43/40 | (2023.01) |

(52) U.S. Cl.
CPC ............. *H10B 43/40* (2023.02); *H10B 41/10* (2023.02); *H10B 41/27* (2023.02); *H10B 41/40* (2023.02); *H10B 43/10* (2023.02); *H10B 43/27* (2023.02)

(58) Field of Classification Search
CPC ......... H01L 27/11551; H01L 27/11556; H01L 27/11578; H01L 27/11582; H10B 43/27; H10B 43/20
See application file for complete search history.

(56) References Cited

U.S. PATENT DOCUMENTS
2020/0105785 A1* 4/2020 Jung .................... H10B 41/27

FOREIGN PATENT DOCUMENTS
| KR | 1020180106727 A | 10/2018 |
| KR | 1020190093987 A | 8/2019 |

\* cited by examiner

*Primary Examiner* — Christopher A Johnson
(74) *Attorney, Agent, or Firm* — WILLIAM PARK & ASSOCIATES LTD.

(57) ABSTRACT

There are provided a memory device and a manufacturing method of the memory device. The memory device includes: a peripheral circuit disposed on a substrate; and a gate stack structure overlapping with the peripheral circuit. The gate stack structure includes a plurality of first cell plugs having substantially a cylindrical structure and a plurality of second cell plugs having substantially a hexagonal prism structure.

19 Claims, 25 Drawing Sheets

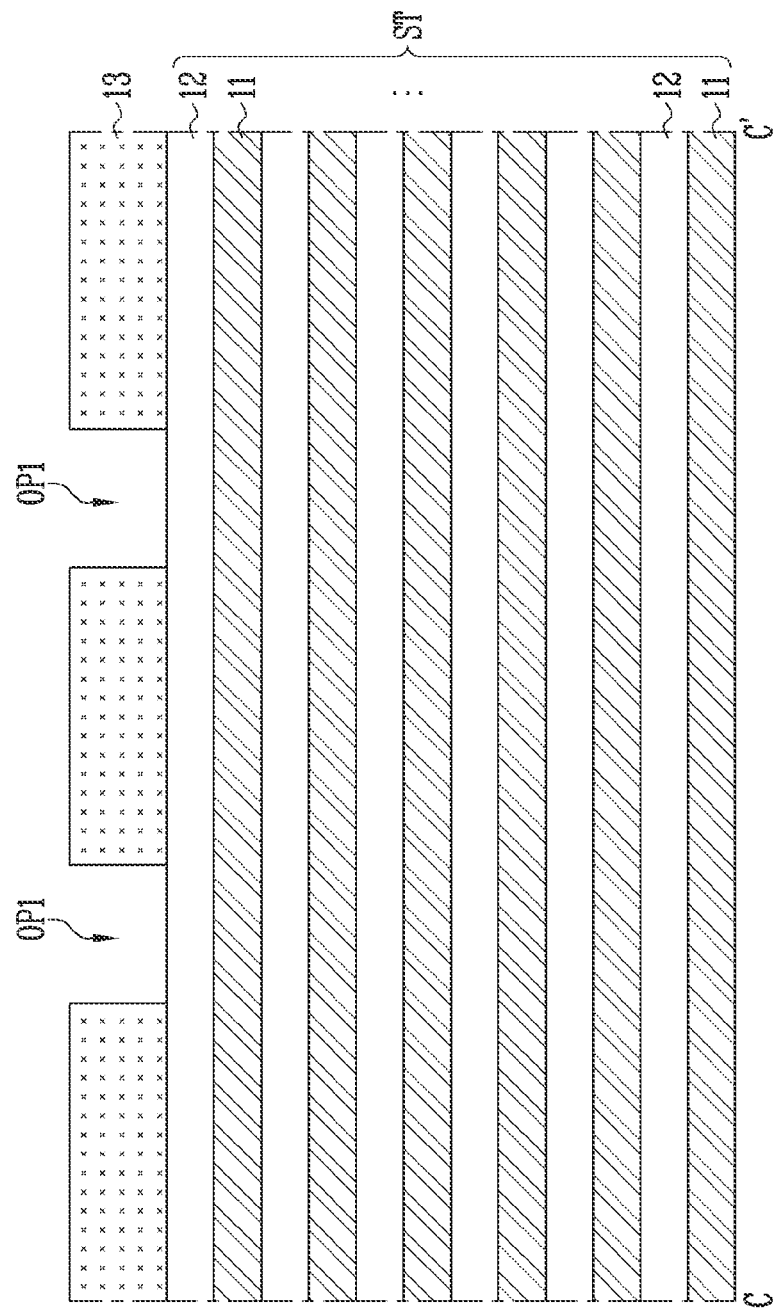

MEMORY DEVICE AND MANUFACTURING METHOD OF THE MEMORY DEVICE

CROSS-REFERENCE TO RELATED APPLICATION

The present application claims priority under 35 U.S.C. § 119(a) to Korean patent application number 10-2020-0150234, filed on Nov. 11, 2020, in the Korean Intellectual Property Office, the entire disclosure of which is incorporated herein by reference.

BACKGROUND

1. Technical Field

The present disclosure generally relates to a memory device and a manufacturing method of the memory device, and more particularly, to a three-dimensional memory device and a manufacturing method of the three-dimensional memory device.

2. Related Art

Recently, the paradigm on computer environments have been turned into ubiquitous computing environments in which computing systems can be used anywhere and anytime. This promotes increasing the usage of portable electronic devices such as mobile phones, digital cameras, notebook computers, and the like. Such portable electronic devices may generally include a memory system using a memory device, i.e., a data storage device. The data storage device is used as a main memory device or an auxiliary memory device of the portable electronic devices.

A data storage device using a memory device has excellent stability and durability, high information access speed, and low power consumption, since there is no mechanical driving part. In an example of memory systems having such advantages, the data storage device includes a Universal Serial Bus (USB) memory device, memory cards having various interfaces, a Solid State Drive (SSD), and the like, The memory device is generally classified into a volatile memory device and a nonvolatile memory device.

The nonvolatile memory device has relatively slow write and read speeds, but retains stored data even when the supply of power is interrupted. Thus, the nonvolatile memory device is used to store data to be retained regardless of whether power is supplied. Examples of the nonvolatile memory include a Read Only Memory (ROM), a Mask ROM (MROM), a Programmable ROM (PROM), an Electrically Programmable ROM (EPROM), an Electrically Erasable and Programmable ROM (EEPROM), a flash memory, a Phase-change RAM (PRAM), a Magnetic RAM (MRAM), a Resistive RAM (RRAM), a Ferroelectric RAM (FRAM), and the like. The flash memory is classified into a NOR type flash memory and a NAND type flash memory.

As the improvement of the degree of integration of semiconductor devices in which memory cells are formed in the form of a single layer over a substrate reaches the limit, there has recently been proposed a three-dimensional nonvolatile memory device in which memory cells are stacked vertically over a substrate.

The three-dimensional nonvolatile memory device includes interlayer insulating layers and gate electrodes, which are alternately stacked, and channel layers penetrating the interlayer insulating layers and the gate electrodes, and memory cells are stacked along the channel layers. Various structures and manufacturing methods have been developed to improve the operational reliability of such a nonvolatile memory device having a three-dimensional structure and to improve a manufacturing yield.

SUMMARY

In accordance with an aspect of the present disclosure, there may be provided a memory device including: a peripheral circuit disposed on a substrate; and a gate stack structure overlapping with the peripheral circuit, wherein the gate stack structure includes a plurality of first cell plugs having substantially a cylindrical structure and a plurality of second cell plugs having substantially a hexagonal prism structure.

In accordance with another aspect of the present disclosure, there may be provided a method of manufacturing a memory device, the method including: forming a stack structure in which a plurality of sacrificial layers and a plurality of interlayer insulating layers are alternately stacked; forming a plurality of first cell plugs penetrating the stack structure; forming first contact plug patterns on the tops of the plurality of first cell plugs; opening upper portions of the stack structure in regions in which a plurality of second cell plugs are to be formed by forming a hard mask pattern on sidewalls of the first contact plug patterns; forming holes penetrating the stack structure by performing an etching process using the hard mask pattern and the first contact plug patterns; removing the plurality of sacrificial layers exposed through the holes, and forming a plurality of plate electrodes by filling a conductive layer in spaces in which the plurality of sacrificial layers are removed; and forming the plurality of second cell plugs in the holes.

In accordance with still another aspect of the present disclosure, there may be provided a method of manufacturing a memory device, the method including: forming a stack structure in which a plurality of sacrificial layers and a plurality of interlayer insulating layers are alternately stacked; forming a plurality of first cell plugs penetrating the stack structure, wherein six of the first cell plugs among the plurality of first cell plugs are formed substantially along a circle to be spaced apart from each other at a certain distance; forming first contact plug patterns on the tops of the plurality of first cell plugs; defining a region in which an upper portion of the stack structure is opened in substantially a hexagonal shape in a central region of the circle by forming a hard mask pattern on sidewalls of the first contact plug patterns; forming holes having substantially a hexagonal prism shape, which penetrate the stack structure, by etching the stack structure of the opened region; forming a plurality of plate electrodes by removing the plurality of sacrificial layers exposed through the holes and filling a conductive layer in spaces in which the plurality of sacrificial layers are removed; and forming a plurality of second cell plugs in the holes.

In accordance with still another aspect of the present disclosure, there may be provided a memory device including: a peripheral circuit disposed on a substrate; and first and second gate stack structures overlapping with the peripheral circuit, wherein each of the first and second gate stack structures includes a plurality of first cell plugs having substantially a cylindrical structure and a plurality of second cell plugs having substantially a hexagonal prism structure, and wherein an isolation region between the first and second gate stack structures has a plurality of interlayer insulating layers and a plurality of sacrificial layers, which are alternately stacked in the isolation region.

In accordance with still another aspect of the present disclosure, there may be provided a method of manufacturing a memory device, the method including: forming a stack structure on a substrate region including a first gate stack structure region and a second gate stack structure region, wherein the stack structure includes a plurality of sacrificial layers and a plurality of interlayer insulating layers, which are alternately stacked; forming a plurality of first cell plugs penetrating the stack structure in the first gate stack structure region and the second gate stack structure region, wherein six first cell plugs among the plurality of first cell plugs are formed substantially along a circle to be spaced apart from each other at a certain distance; forming first contact plug patterns on the tops of the plurality of first cell plugs; defining a region in which an upper portion of the stack structure is opened in substantially a hexagonal shape in a central region of the circle by forming a hard mask pattern on sidewalk of the first contact plug patterns; forming holes having substantially a hexagonal prism shape, which penetrate the stack structure, by etching the stack structure of the opened region; removing the plurality of sacrificial layers exposed through the holes, wherein the plurality of sacrificial layers remain in a boundary region between the first gate stack structure region and the second gate stack structure region; forming a plurality of plate electrodes by filling a conductive layer in spaces in which the plurality of sacrificial layers are removed in the first gate stack structure region and spaces in which the plurality of sacrificial layer are removed in the second gate stack structure region; and forming a plurality of second cell plugs in the holes.

BRIEF DESCRIPTION OF THE DRAWINGS

Examples of embodiments will now be described more fully hereinafter with reference to the accompanying drawings; however, they may be embodied in different forms and should not be construed as limited to the embodiments set forth herein.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 13A, 13B, 14, 15A, 15B, and 16 are views illustrating a process of forming a gate stack structure in accordance with another embodiment of the present disclosure.

DETAILED DESCRIPTION

Figure 1:
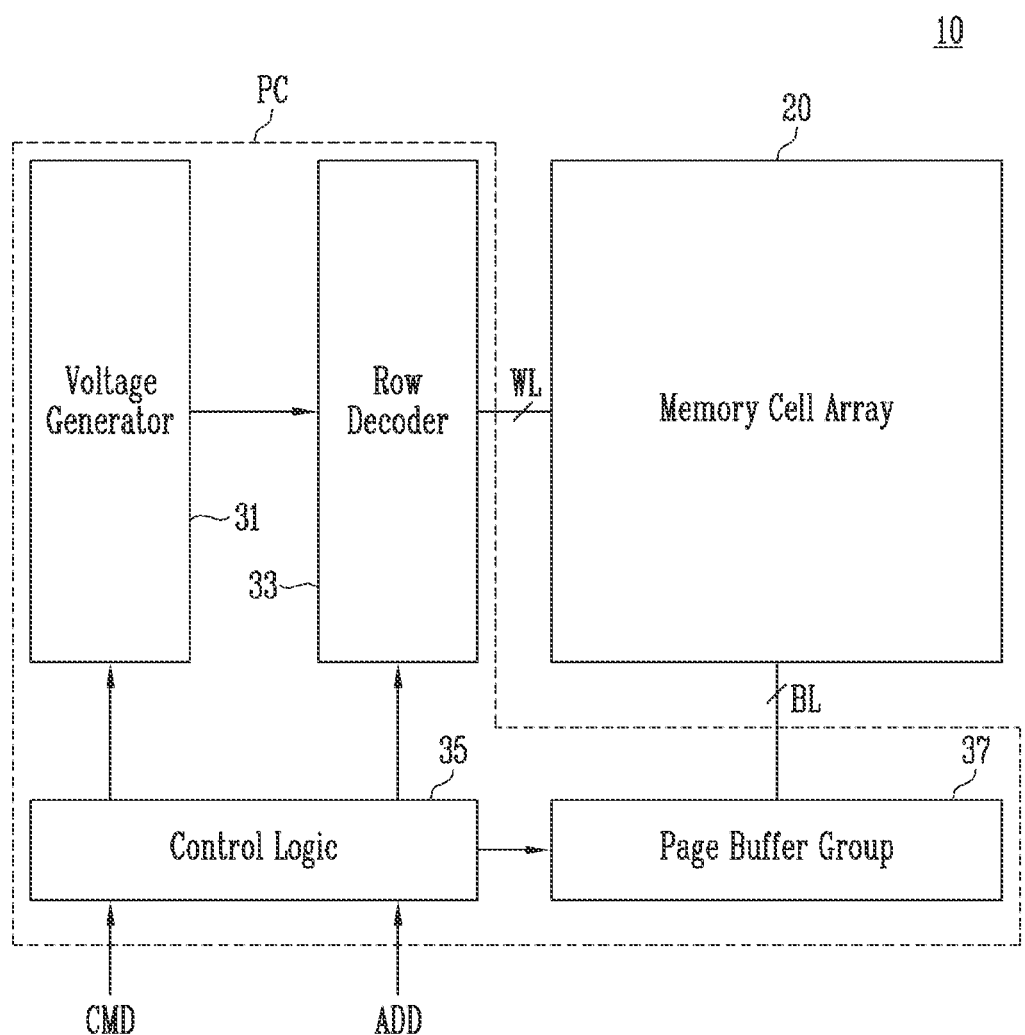
FIG. 1 is a block diagram illustrating a memory device in accordance with an embodiment of the present disclosure.

Hereinafter, examples of embodiments of the present disclosure will be described. In drawings, thicknesses and distances are expressed for convenience of description, and may be exaggerated and illustrated as compared with actual physical thicknesses and distances. In the present specification, a known configuration unrelated to the present disclosure may be omitted. In the specification, when reference numerals are endowed to components in each drawing, it should be noted that like reference numerals denote like elements even though they are depicted in several drawings.

Embodiments provide a memory device having an easy manufacturing process, a stable structure, and an improved degree of integration, and a manufacturing method of the memory device.

FIG. 1 is a block diagram illustrating a memory device in accordance with an embodiment of the present disclosure.

Referring to FIG. 1, the memory device 10 may include a peripheral circuit PC and a memory cell array 20.

The peripheral circuit PC may be configured to control a program operation for storing data in the memory cell array 20, a read operation for outputting data stored in the memory cell array 20, and an erase operation for erasing data stored in the memory cell array 20.

In an embodiment, the peripheral circuit PC may include a voltage generator 31, a row decoder 33, a control logic 35, and a page buffer group 37. The control logic 35 may be implemented as hardware, software, or a combination of hardware and software. For example, the control logic 35 may be a control logic circuit operating in accordance with an algorithm and/or a processor executing control logic code.

The memory cell array 20 may include a plurality of memory blocks, and each of the memory blocks may include a plurality of memory cells in which data is stored. The memory cells may be arranged three-dimensionally.

The memory cell array 20 may be connected to the row decoder 33 through word lines WL, and be connected to the page buffer group 37 through bit lines BL.

The control logic 35 may control the peripheral circuit PC in response to a command CMD and an address ADD.

The voltage generator 31 may generate various operating voltages used for a program operation, a read operation, and an erase operation, under the control of the control logic 35. The operating voltages may include a program voltage, a verify voltage, a pass voltage, a read voltage, an erase voltage, and the like.

The row decoder 33 may provide the memory cell array 20 with the operating voltage generated by the voltage generator under the control of the control logic 35. For example, the row decoder 33 may provide the operating voltages generated by the voltage generator 31 to at least one selected memory block among the plurality of memory blocks included in the memory cell array 20.

The page buffer group 37 may be connected to the memory cell array 20 through the bit lines BL. The page buffer group 37 may temporarily store data received from an input/output circuit (not shown) in a program operation under the control of the control logic 35, and control a potential of the bit lines BL, based on the temporarily stored data. The page buffer group 37 may sense a voltage or current of the bit lines BL in a read operation or a verify operation under the control of the control logic 35.

Structurally, the memory cell array 20 may be disposed on the peripheral circuit PC. The memory cell array 20 may overlap with a portion of the peripheral circuit PC.

Figure 2:
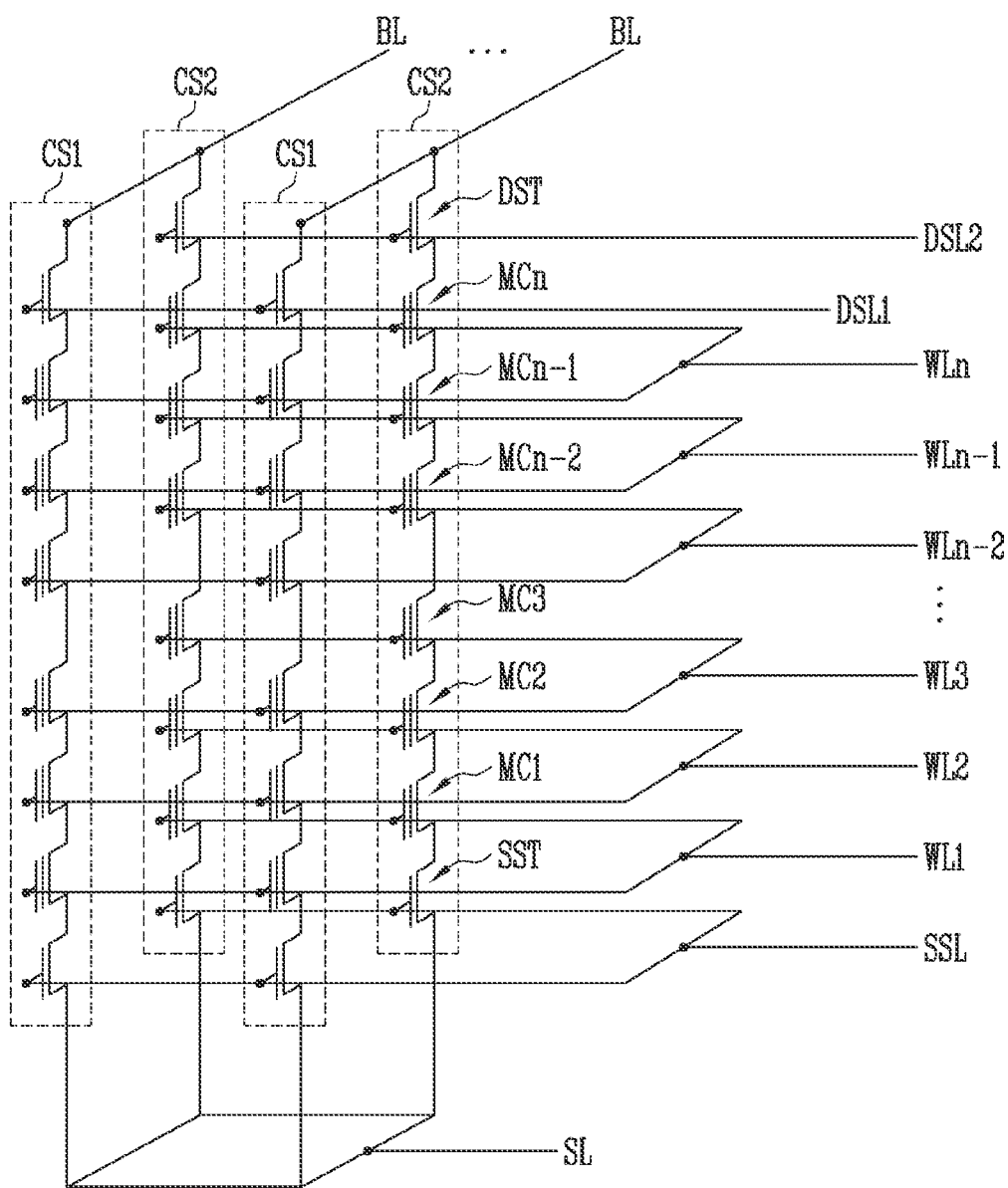
FIG. 2 is a circuit diagram illustrating a memory cell array in accordance with an embodiment of the present disclosure.

FIG. 2 is a circuit diagram illustrating a memory cell array in accordance with an embodiment of the present disclosure.

Referring to FIG. 2, the memory cell array 20 may include a plurality of cell strings CS1 and CS2 connected between a source line SL and a plurality of bit lines BL. The plurality of cell strings CS1 and CS2 may be commonly connected to a plurality of word lines WL1 to WLn. 'N' may be an integer greater than 1.

Each of the plurality of cell strings CS1 and CS2 may include at least one source select transistor SST connected to the source line SL, at least one drain select transistor DST connected to the bit line BL, and a plurality of memory cells MC1 to MCn connected in series between the source select transistor SST and the drain select transistor DST.

Gates of the plurality of memory cells MC1 to MCn may be respectively connected to the plurality of word lines WL1 to WLn stacked to be spaced apart from each other. Two or more drain select lines DSL1 and DSL2 may be spaced apart from each other at the same level.

A gate of the source select transistor SST may be connected to a source select line SSL. A gate of the drain select transistor DST may be connected to a drain select line corresponding to the gate of the drain select transistor DST.

The source line SL may be connected to a source of the source select transistor SST. A drain of the drain select transistor DST may be connected to a bit line corresponding to the drain of the drain select transistor DST.

The plurality of cell strings CS1 and CS2 may be divided into string groups respectively connected to the two or more drain select lines DSL1 and DSL2. Cell strings connected to the same word line and the same bit line may be independently controlled by different drain select lines. Also, cell strings connected to the same drain select line may be independently controlled by different bit lines.

In an embodiment, the two or more drain select lines DSL1 and DSL2 may include a first drain select line DSL1 and a second drain select line DSL2. The plurality of cell strings CS1 and CS2 may include a first cell string CS1 of a first cell string group connected to the first drain select line DSL1 and a second cell string CS2 of a second string group connected to the second drain select line DSL2.

Figure 3:
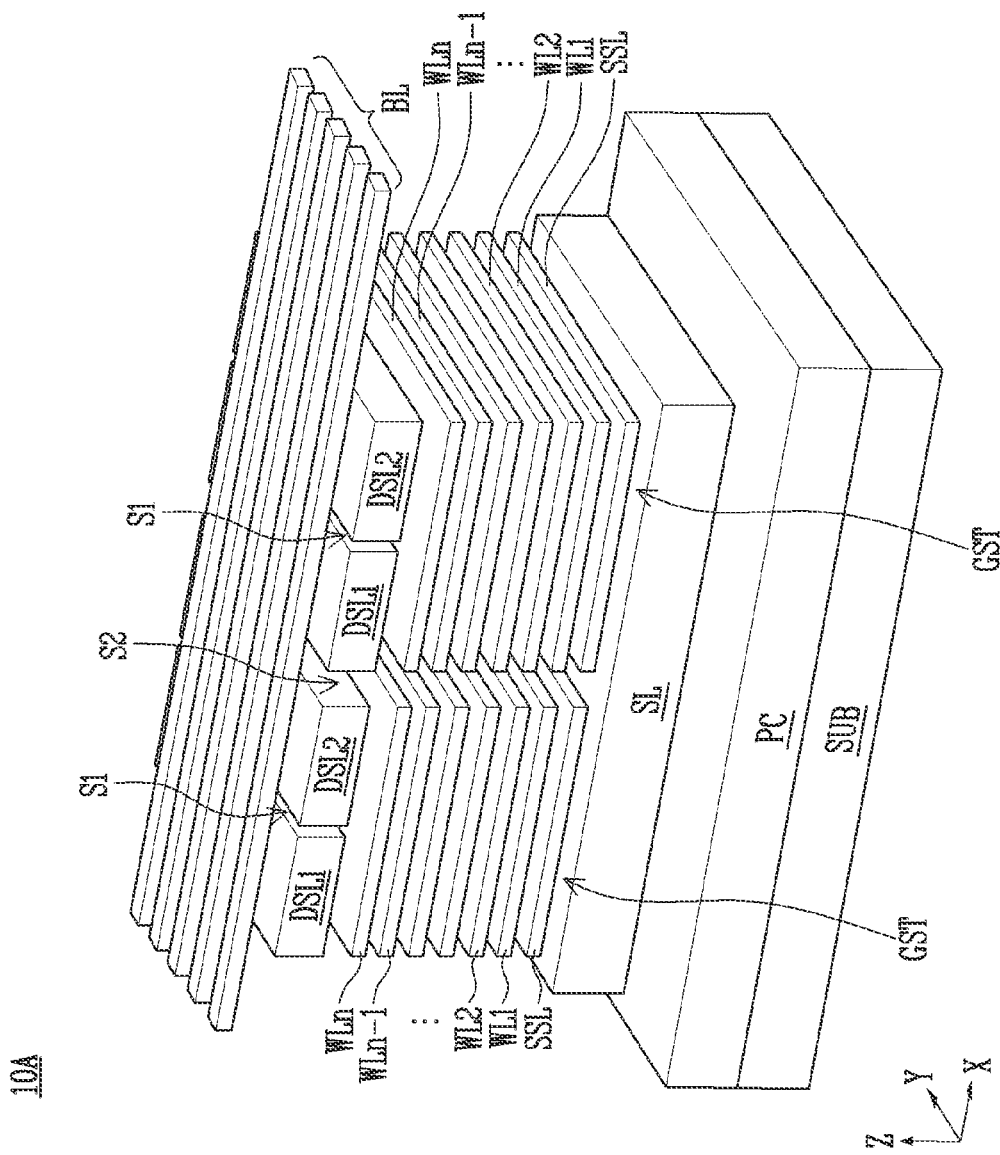
FIGS. 3 and 4 are perspective views illustrating memory devices in accordance with embodiments of the present disclosure.
Figure 4:
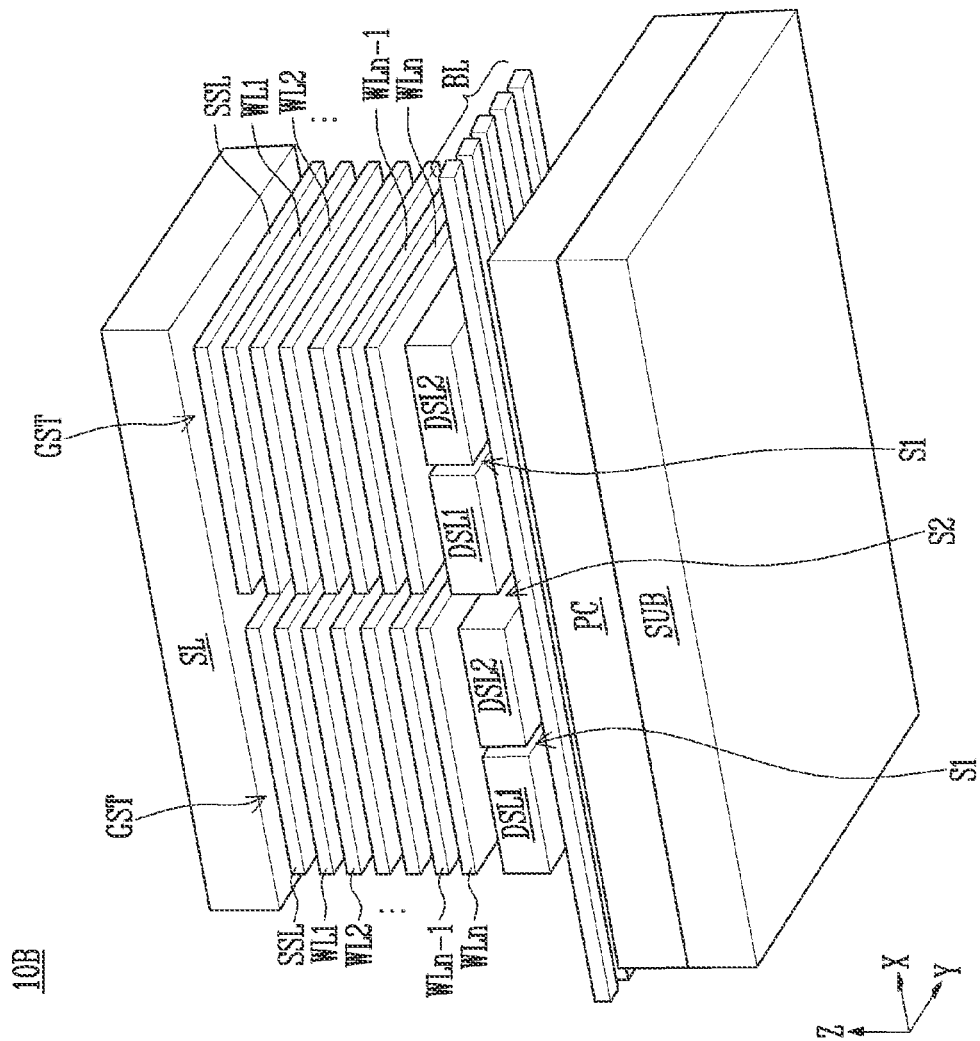

FIGS. 3 and 4 are perspective views illustrating memory devices in accordance with embodiments of the present disclosure.

Referring to FIGS. 3 and 4, each of the memory devices 10A and 10B may include a peripheral circuit PC disposed on a substrate SUB and gate stack structures GST overlapping with the peripheral circuit PC.

Each of the gate stack structures GST may include a source select line SSL, a plurality of word lines WL1 to WLn, and two or more drain select lines DSL1 and DSL2 isolated from each other at the same level by a first slit S1.

The source select line SSL and the plurality of word lines WL1 to WLn may be formed in a plate shape which expands in a first direction X and a second direction Y and is parallel to a top surface of the substrate SUB. The first direction X may be a direction in which an X-axis faces in an XYZ coordinate system, and the second direction Y may be a direction in which a Y-axis faces in the XYZ coordinate system.

The plurality of word lines WL1 to WLn may be stacked to be spaced apart from each other in a third direction Z. The third direction Z may be a direction in which a Z-axis faces in the XYZ coordinate system. The plurality of word lines WL1 to WLn may be disposed between the two or more drain select lines DSL1 and DSL2 and the source select line SSL.

The gate stack structures GST may be isolated from each other by a second slit S2. The first slit S1 may be formed shorter than the second slit S2 in the third direction Z, and overlap with the plurality of word lines WL1 to WLn.

Each of the first slit S1 and the second slit S2 may extend in a linear shape, extend in a zigzag shape, or extend in a wave form. A width of each of the first slit S1 and the second slit S2 may be variously changed according to a design rule.

Referring to FIG. 3, in accordance with an embodiment, the source select line SSL may be disposed closer to the peripheral circuit PC than the two or more drain select lines DSL1 and DSL2.

The memory device 10A may include a source line SL disposed between the gate stack structure GST and the peripheral circuit PC and a plurality of bit lines BL spaced more apart from the peripheral circuit PC than the source line SL. The gate stack structures GST may be disposed between the plurality of bit lines BL and the source line SL.

Referring to FIG. 4, in accordance with an embodiment, the two or more drain select lines DSL1 and DSL2 may be disposed closer to the peripheral circuit PC than the source select line SSL.

The memory device 10B may include a plurality of bit lines BL disposed between the gate stack structures GST and the peripheral circuit PC and a source line SL spaced more apart from the peripheral circuit PC than the plurality of bit lines BL. The gate stack structures GST may be disposed between the plurality of bit lines BL and the source line SL.

Figure 5A:
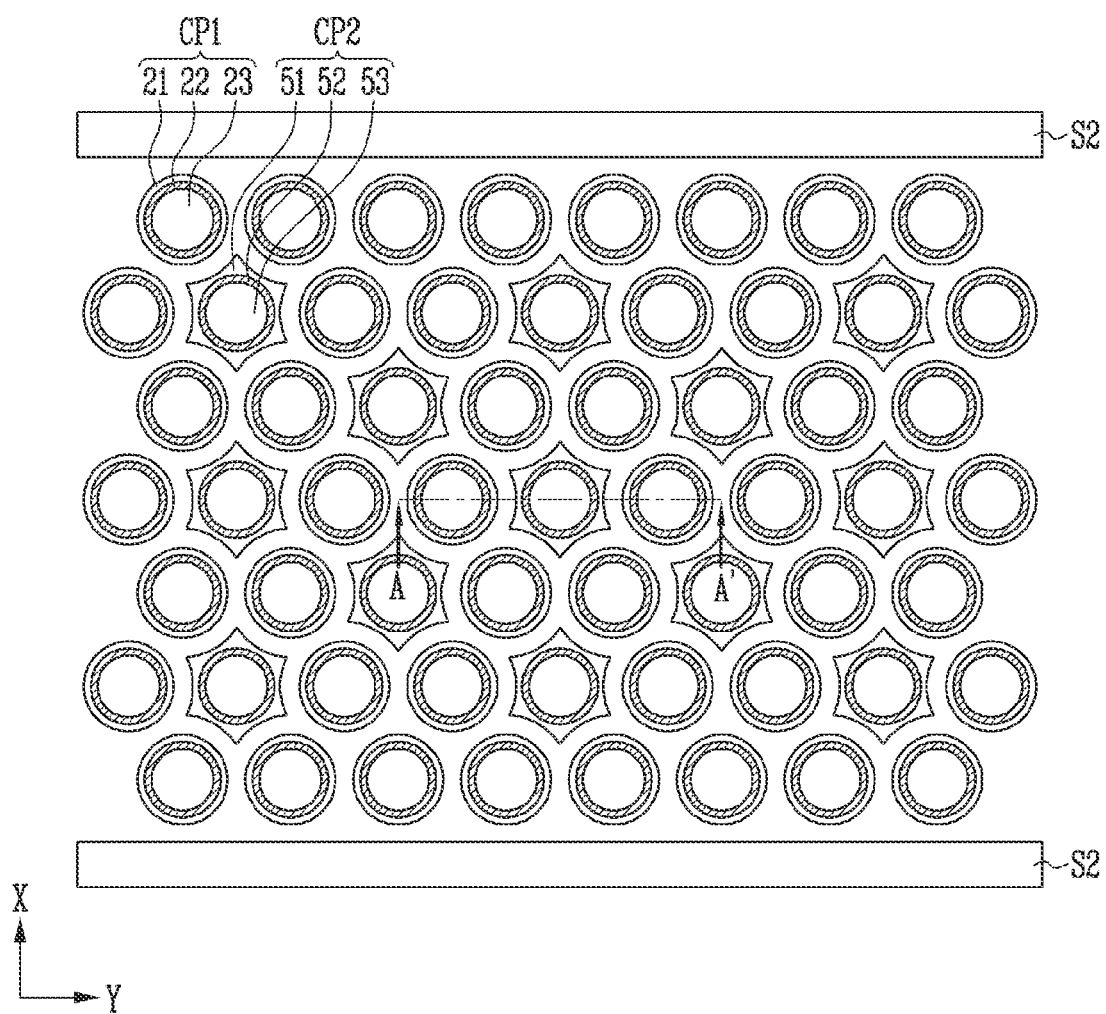
FIGS. 5A and 5B are plan and sectional views illustrating a gate stack structure in accordance with an embodiment of the present disclosure.
Figure 5B:
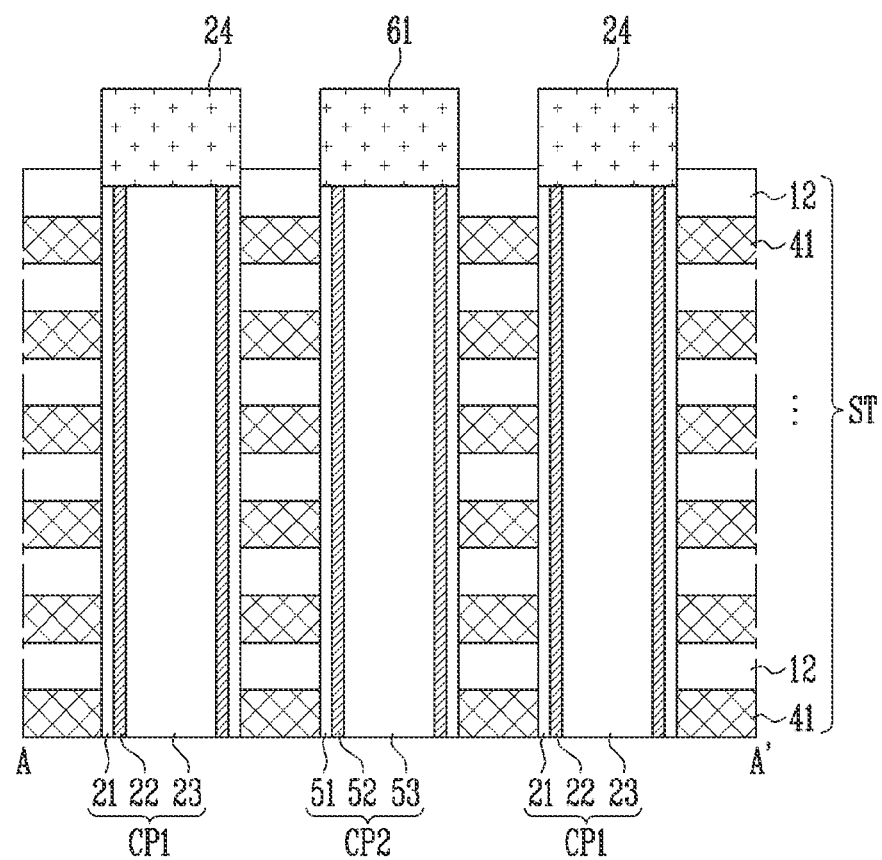

FIGS. 5A and 5B are plan and sectional views illustrating a gate stack structure in accordance with an embodiment of the present disclosure.

Referring to FIG. 5A, the gate stack structure may include a plurality of first cell plugs CP1 and a plurality of second cell plugs CP2, which are disposed between second sits S2. For example, a plurality of first cell plugs CP1 may be disposed to surround the periphery of one second cell plug CP2. For example, six first cell plugs CP1 may be disposed at the periphery of one second cell plug CP2 to be spaced apart from each other at a certain distance. Although a case where six first cell plugs CP1 are disposed at the periphery of one second cell plug CP2 is illustrated in FIG. 5A, the present disclosure is not limited thereto, and at least four first cell plugs CP1 may be disposed at the periphery of one second cell plug CP2. The first cell pugs CP1 may have a cylindrical shape, and the second cell pugs CP2 may have a hexagonal prism structure.

FIG. 5B is a sectional view of the gate stack structure taken along line A-A' shown in FIG. 5A.

Referring to FIG. 5B, the gate stack structure may include a stack structure ST in which a plurality of plate electrodes 41 and a plurality of interlayer insulating layers 12 are alternately stacked and first and second cell plugs CP1 and CP2 penetrating the stack structure ST.

The first cell plug CP1 may include a core insulating layer 23 vertically extending in a stacking direction of the stack structure ST, a channel layer 22 surrounding the core insulating layer 23, and a memory layer 21 surrounding the channel layer 22.

The core insulating layer 23 may extend in a vertical direction from a central region of the first cell plug CP1, and be formed as an insulating layer such as an oxide layer. The channel layer 22 may be used as a channel region of a cell string. The channel layer 22 may include a semiconductor layer. In an embodiment, the channel layer 22 may include silicon. The memory layer 21 may store data. The memory layer 21 may be formed as a multi-layer, and include, for example, a tunnel insulating layer, a charge storage layer, and a blocking insulating layer. The tunnel insulating layer may surround a sidewall of the channel layer 22. The tunnel insulating layer may be formed as a silicon oxide layer through which charges can tunnel. The charge storage layer may surround a sidewall of the tunnel insulating layer. The charge storage layer may be formed as a material layer capable of storing data changed using Fowler-Nordheim tunneling. In an embodiment, the charge storage layer may be formed as a charge trap nitride layer. The blocking insulating layer may surround a sidewall of the charge storage layer. The blocking insulating layer may include an oxide layer capable of blocking charges.

A first contact plug pattern 24 may be formed on the top of the first cell plug CP1.

One second cell plug CP2 may be disposed between two first cell plugs CP1. The second cell plug CP2 may include a core insulating layer 53 vertically extending in the stacking direction of the stack structure ST, a channel layer 52 surrounding the core insulating layer 53, and a memory layer 51 surrounding the channel layer 52.

The core insulating layer 53 may extend in the vertical direction from a central region of the second cell plug CP2, and be formed as an insulating layer such as an oxide layer. The channel layer 52 may be used as a channel region of a cell string. The channel layer 52 may include a semiconductor layer. In an embodiment, the channel layer 52 may include silicon. The memory layer 51 may store data. The memory layer 51 may be formed as a multi-layer, and include, for example, a tunnel insulating layer, a charge storage layer, and a blocking insulating layer. The tunnel insulating layer may surround a sidewall of the channel layer 52. The tunnel insulating layer may be formed as a silicon oxide layer through which charges can tunnel. The charge storage layer may surround a sidewall of the tunnel insulating layer. The charge storage layer may be formed as a material layer capable of storing data changed using Fowler-Nordheim tunneling. In an embodiment, the charge storage layer may be formed as a charge trap nitride layer. The blocking insulating layer may surround a sidewall of the charge storage layer. The blocking insulating layer may include an oxide layer capable of blocking charges.

A second contact plug pattern 61 may be formed on the top of the second cell plug CP2.

FIGS. 6A, 6B, 7, 8A, 8B, 8C, 9, and 10 are views illustrating a process of forming a gate stack structure in accordance with an embodiment of the present disclosure.

Figure 6A:
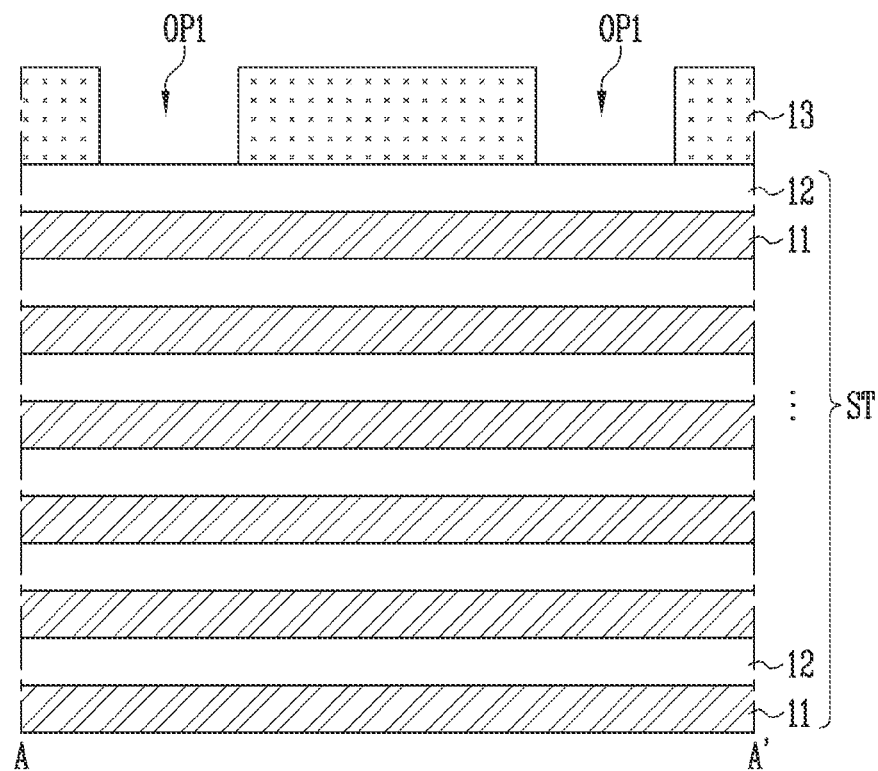
FIGS. 6A, 6B, 7, 8A, 8B, 8C, 9, and 10 are views illustrating a process of forming a gate stack structure in accordance with an embodiment of the present disclosure.
Figure 6B:
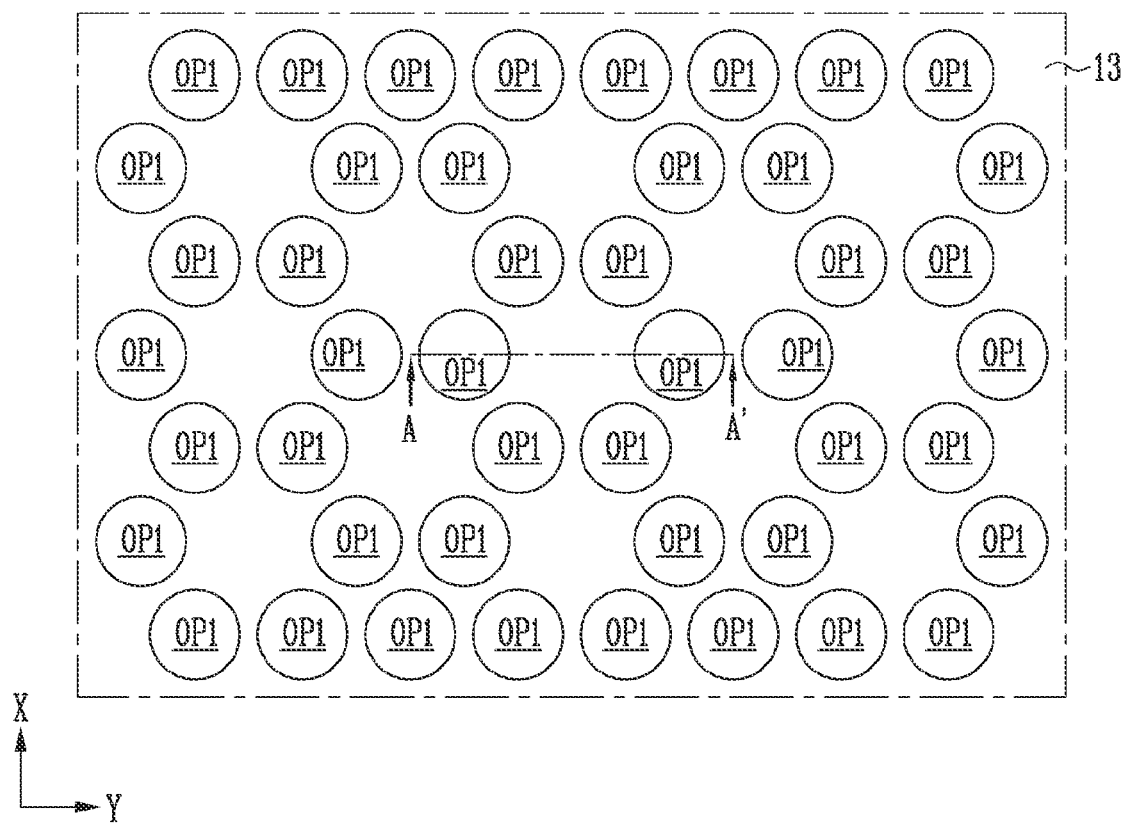

Referring to FIGS. 6A and 6B, a stack structure ST may be formed, in which sacrificial layers 11 and interlayer insulating layers 12 are alternately stacked. The stack structure ST may be formed on a substrate (not shown) including a peripheral circuit.

The sacrificial layers 11 may be formed of a material different from that of the interlayer insulating layers 12. For example, the interlayer insulating layers 12 may be formed of oxide such as silicon oxide. The sacrificial layers 11 may be formed of a material having an etching rate different from that of the interlayer insulating layers 12. For example, the sacrificial layers 11 may be formed of nitride such as silicon nitride.

Subsequently, a first hard mask pattern 13 in which regions OP1 in which first cell plugs are to be formed are opened is formed on the stack structure ST.

For example, in the first hard mask pattern 13, regions OP1 in which six first cell plugs are to be formed may be disposed along one circle. The regions OP1 in which six first cell plugs are to be formed may be formed to be spaced apart from each other at a certain distance.

Figure 7:
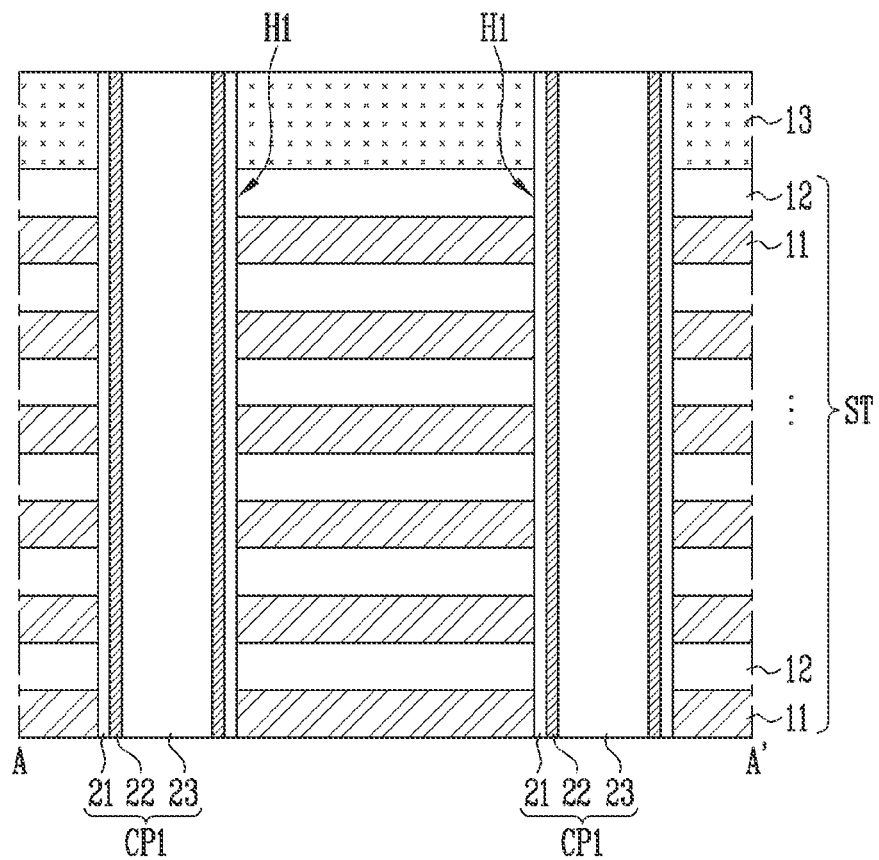

Referring to FIG. 7, a plurality of first holes H1 penetrating the stack structure ST are formed by performing an etching process using the first hard mask pattern 13. Subsequently, first cell plugs CP1 are formed in the first holes H1. The first cell plugs CP1 may be formed by sequentially stacking a memory layer 21, a channel layer 22, and a core insulating layer 23 on sidewalls of the first holes H1.

The memory layer 21 may be formed as a mufti-layer. For example, the memory layer 21 may include a blocking insulating layer, a charge storage layer, and a tunnel insulating layer. The blocking insulating layer may be formed on the sidewalls of the first holes H1. The blocking insulating layer may include an oxide layer capable of blocking charges. In an embodiment, the blocking insulating layer may be formed of $Al_2O_3$. The charge storage layer may be formed on a sidewall of the blocking insulating layer. The charge storage layer may be formed as a charge trap layer, be formed as a material layer including a conductive nano dot, or be formed as a phase change material layer. For example, the charge storage layer may store data changed using Fowler-Nordheim tunneling. To this end, the charge storage layer may be formed as a silicon nitride layer in which charges can be trapped. The tunnel insulating layer may be formed on a sidewall of the charge storage layer. The tunnel insulating layer may be formed as a silicon oxide layer through which charges can tunnel.

The channel layer 22 may include a semiconductor layer. In an embodiment, the channel layer 22 may include silicon.

The core insulating layer 23 may be formed by filling central regions of the first holes H1. The core insulating layer may be formed as an oxide layer.

Figure 8A:
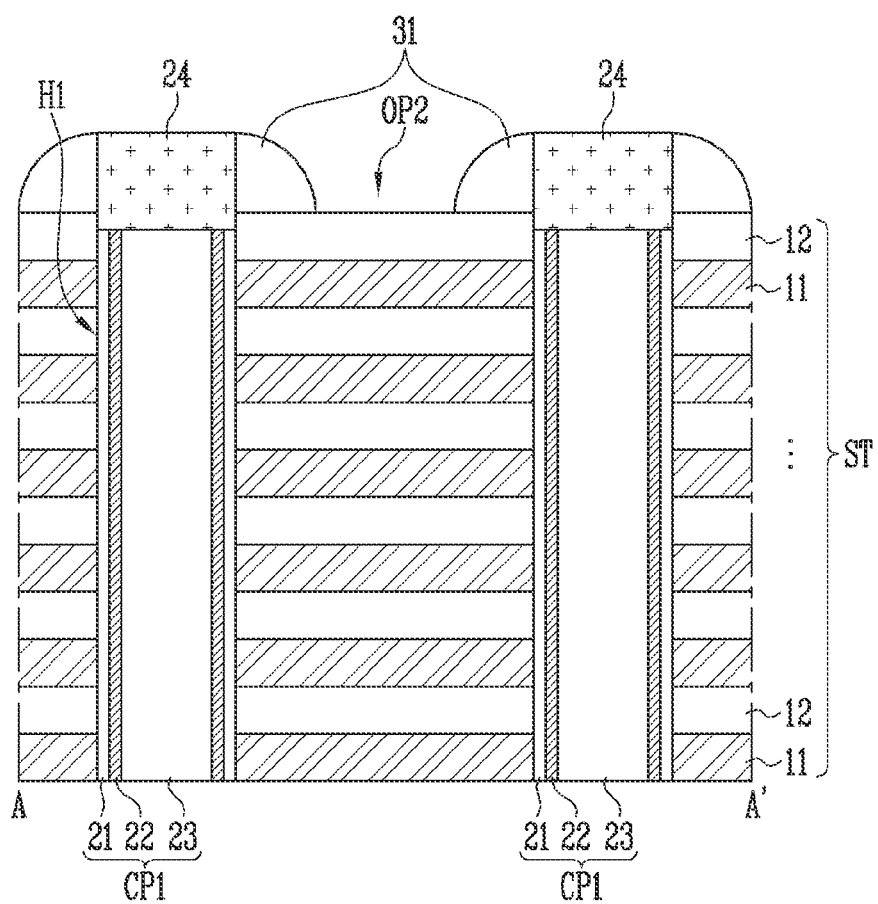
Figure 8B:
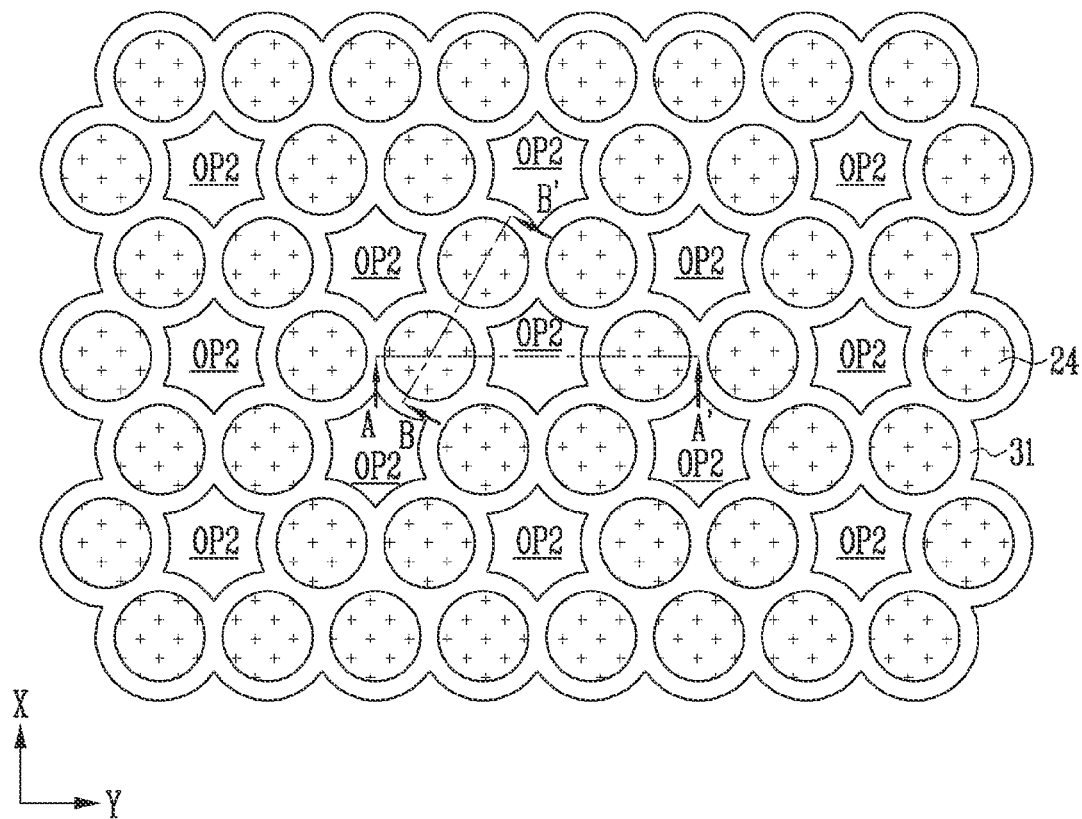

Referring to FIGS. 8A and 8B, upper portions of the first cell plugs CP1 may be etched by a certain thickness. For example, the upper portions of the first cell plugs CP1 may be etched by the certain thickness such that an upper surface of the first cell plugs CP1 is higher than that of the sacrificial layer 11 locate at an uppermost portion and is lower than that of the interlayer insulating layer 12 located at an uppermost portion.

Subsequently, a first contact plug pattern 24 may be formed in spaces in which the first cell plugs CP1 are etched and removed. In an embodiment, the first contact plug pattern 24 may be formed as a doped semiconductor layer.

Subsequently, the first hard mask pattern is removed. Therefore, the first contact plug pattern 24 further protrudes than the stack structure ST. Subsequently, a second hard mask pattern 31 is formed on a sidewall of the protruding first contact plug pattern 24.

A method of forming the second hard mask pattern 31 will be described as follows.

A hard mask layer is formed on the entire structure including the protruding first contact plug pattern 24. Subsequently, the second hard mask pattern 31 is formed on the sidewall of the protruding first contact plug pattern 24 by entirely etching the hard mask layer. As an entire etching process result, the hard mask layer remains on the sidewall of the protruding first contact plug patter 24, and accordingly, an upper surface of the first contact plug pattern 24 and a portion of the stack structure ST between the first cell plugs CP1 are exposed. That is, a region OP2 in which a second cell plug is to be formed is opened between the first cell plugs CP1. The region OP2 in which the second cell plug is to be formed may be defined in a hexagonal shape as shown in FIG. 8B. That is, an open region having a hexagonal shape is defined in a central region of six first cell plugs CP1 disposed in a circular shape.

Figure 8C:
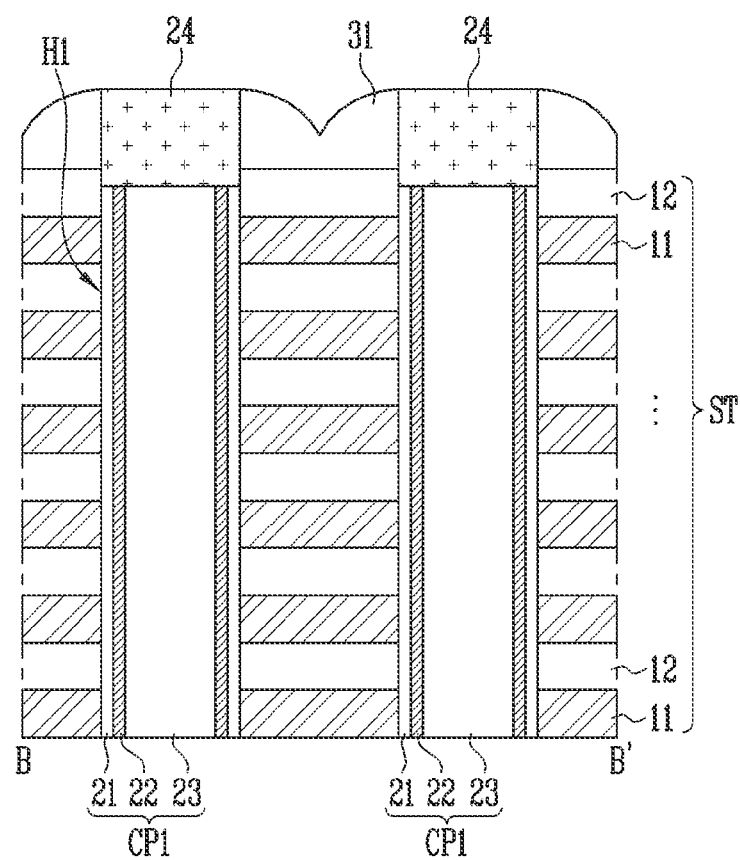

FIG. 8C is a sectional view of the gate stack structure taken along line B-B' shown in FIG. 8B.

Referring to FIGS. 8B and 8C, when a distance between first cell plugs CP1 adjacent to each other is smaller than two times of a lateral thickness of the second hard mask pattern 31, an upper portion of the stack structure ST between the first cell plugs CP1 adjacent to each other is not opened by the second hard mask pattern 31. That is, a space between the first contact plug patterns 24 respectively formed on the tops of the first cell plugs CP1 adjacent to each other is filled by the second hard mask pattern 31, and accordingly, the upper portion of the stack structure ST between the first cell plugs CP1 is covered by the second hard mask pattern 31.

Figure 9:
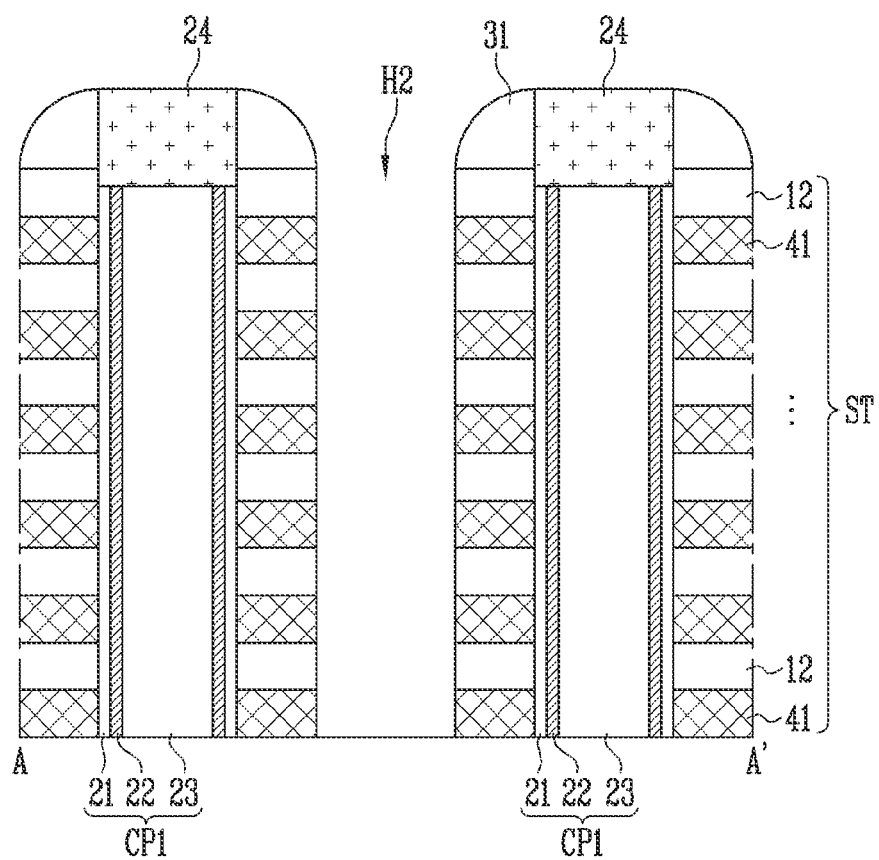

Referring to FIG. 9, a second hole H2 penetrating the stack structure ST is formed by performing an etching process using, as an etch mask, the second hard mask pattern 31 and the first contact plug pattern 24. That is, the second hole H2 is formed by etching the stack structure ST of a region in which a second cell plug is to be formed. Sidewalls of the sacrificial layers are exposed by the second hole H2.

The sacrificial layers exposed through the second hole H2 are removed. Subsequently, plate electrodes 41 are formed by filling a conductive material in spaces in which the sacrificial layers are removed.

Figure 10:
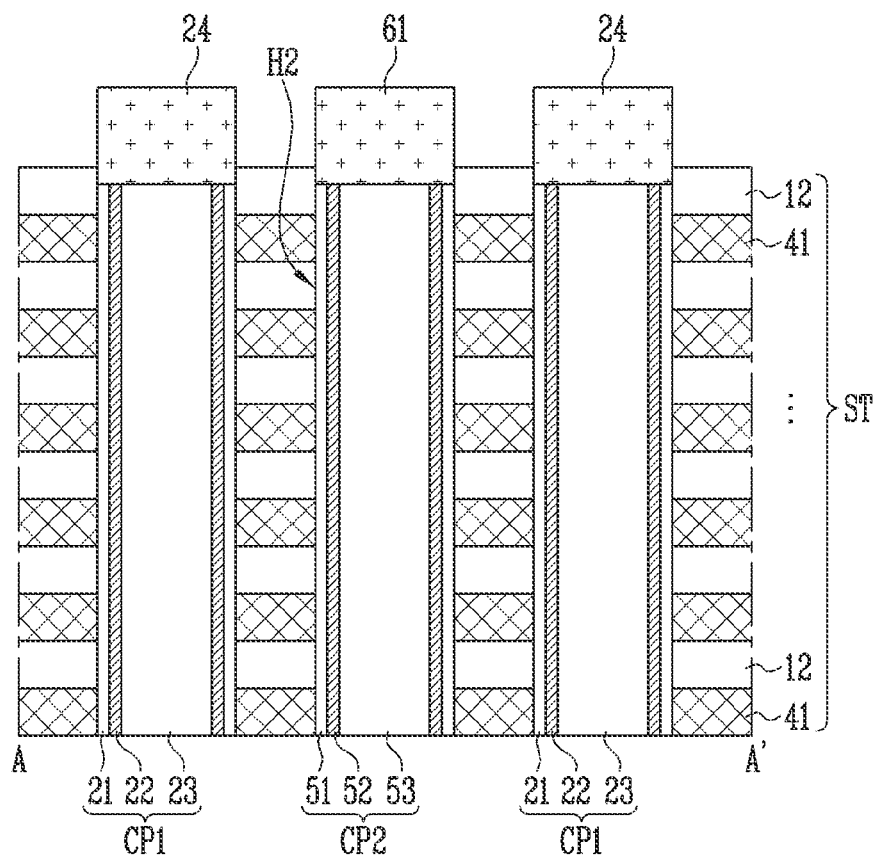

Referring to FIG. 10, a second cell plug CP2 is formed in the second hole H2. The second cell plug CP2 may be formed by sequentially stacking a memory layer 51, a channel layer 52, and a core insulating layer 53 on a sidewall of the second hole H2.

The memory layer 51 may be formed as a multi-layer. For example, the memory layer 51 may include a blocking insulating layer, a charge storage layer, and a tunnel insulating layer. The blocking insulating layer may be formed on the sidewall of the second hole H2. The blocking insulating layer may include an oxide layer capable of blocking charges. In an embodiment, the blocking insulating layer may be formed of $Al_2O_3$. The charge storage layer may be formed on a sidewall of the blocking insulating layer. The charge storage layer may be formed as a charge trap layer, be formed as a material layer including a conductive nano dot, or be formed as a phase change material layer. For example, the charge storage layer may store data changed using Fowler-Nordheim tunneling. To this end, the charge storage layer may be formed as a silicon nitride layer in which charges can be trapped. The tunnel insulating layer may be formed on a sidewall of the charge storage layer. The tunnel insulating layer may be formed as a silicon oxide layer through which charges can tunnel.

The channel layer 52 may include a semiconductor layer. In an embodiment, the channel layer 52 may include silicon.

The core insulating layer 53 may be formed to fill a central region of the second hole H2. The core insulating layer 53 may be formed as an oxide layer.

The memory layer 51, the channel layer 52, and the core insulating layer 53, which constitute the second cell plug CP2, may be formed as the same layers as the memory layer 21, the channel layer 22, and the core insulating layer 23, which constitute the first cell plug CP1.

Subsequently, the second hard mask pattern may be removed. When the second hard mask pattern is formed of a non-conductive material, the process of removing the second hard mask pattern may be skipped.

Figure 11:
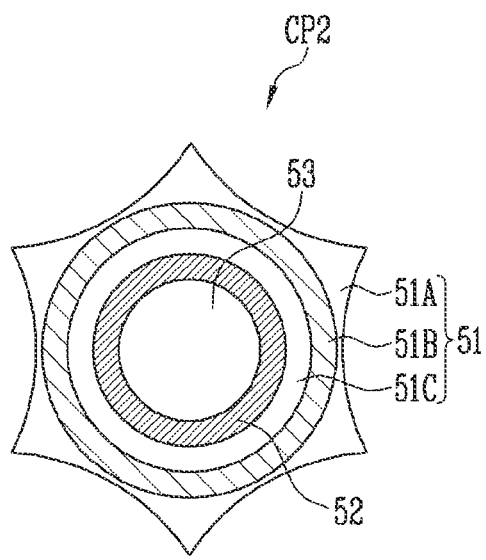
FIG. 11 is a horizontal sectional view illustrating a second cell plug shown in FIG. 10.

FIG. 11 is a horizontal sectional view illustrating the second cell plug shown in FIG. 10.

Referring to FIG. 11, the second cell plug CP2 may include a memory layer 51, a channel layer 52, and a core insulating layer 53, which are sequentially formed on a surface of the second hole H2 shown in FIG. 9. And the memory layer 51 may include a blocking insulating layer 51A, a charge storage layer 51B, and a tunnel insulating layer 51C.

The second hole H2 is formed in a hexagonal prism shape according to the open region of the second hard mask pattern 31 shown in FIG. 8B, and accordingly, the second cell plug CP2 formed in the second hole H2 is formed in a hexagonal prism shape.

In a process of forming the blocking insulating layer 51A formed on the sidewall of the second hole H2 having the hexagonal prism shape, a nitride layer is deposited on the sidewall of the second hole H2 having the hexagonal prism shape, and the blocking insulating layer 51A is formed by replacing the nitride layer with an oxide layer through an oxidation process. An outer wall of the blocking insulating layer 51, which is in contact with the sidewall of the second hole H2, is formed in a hexagonal prism shape, but an inner wall of the blocking insulating layer 51, which is in contact with the charge storage layer 51B, may be formed in a cylindrical shape in a subsequent process.

Subsequently, the memory layer 51 is formed by sequentially depositing the charge storage layer 51B and the tunnel insulating layer 51C on the inner wall of the blocking insulating layer 51A, the channel layer 52 is formed on a sidewall of the tunnel insulating layer 51, and the central region of the second hole H2 is filled with the core insulating layer 53. Accordingly, a horizontal section of the blocking insulating layer 51A may be formed in a hexagonal shape, and a horizontal section of each of the channel layer 51B, the tunnel insulating layer 51C, the channel layer 52, and the core insulating layer 53 may be formed in a circular shape.

As described above, in accordance with the embodiment of the present disclosure, after the first cell plugs CP1 are formed, the second holes H2 for removing the sacrificial layer 11 is formed in the space between the first cell plugs CP1. Subsequently, after the sacrificial layer 11 is removed through the second holes H2, the second cell plugs CP2 are formed in the second holes H2.

Figure 12:
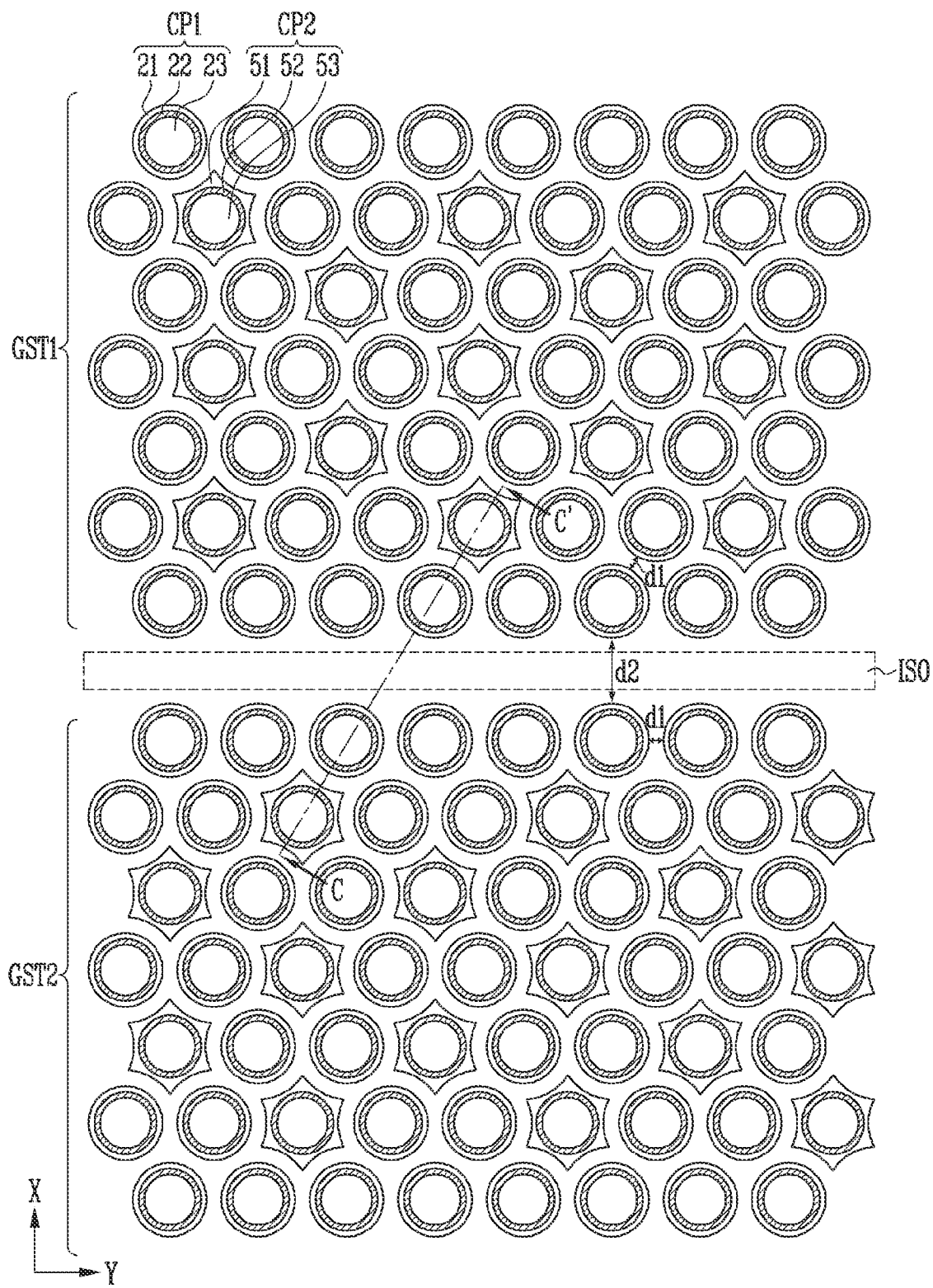
FIG. 12 is a sectional view illustrating a gate stack structure in accordance with another embodiment of the present disclosure.

FIG. 12 is a sectional view illustrating a gate stack structure in accordance with another embodiment of the present disclosure.

Referring to FIG. 12, a first gate stack structure GST1 and a second gate stack structure GST2 may be disposed adjacent to each other. A space between the first gate stack structure GST1 and the second gate stack structure GST2 may be defined as an isolation region ISO, and plate electrodes of the first gate stack structure GST1 and plate electrodes of the second gate stack structure GST2 may be electrically isolated from each other by the isolation region ISO.

The first gate stack structure GST1 and the second gate stack structure GST2 may include a plurality of first cell plugs CP1 and a plurality of second cell pugs CP2, For example, a plurality of first cell plugs CP1 may be disposed to surround the periphery of one second cell plug CP2. For example, six first cell plugs CP1 may be disposed at the periphery of one second cell plug CP2 to be spaced apart from each other at a certain distance. Although a case where six first cell plugs CP1 are disposed at the periphery of one second cell plug CP2 has been illustrated in FIG. 12, the present disclosure is not limited thereto, and at least four first cell plugs CP1 may be disposed at the periphery of one second cell plug CP2. The first cell plugs CP1 may have a cylindrical structure, and the second cell plugs CP2 may have a hexagonal prism structure. First cell plugs adjacent to each other among the first cell plugs CP1 included in the first gate stack structure GST1 may be disposed to be spaced apart from each other at a first distance d1, and first cell plugs adjacent to each other among the first cell plugs CP1 included in the second gate stack structure GST2 may be disposed to be spaced apart from each other at the first distance d1. In addition, first cell plugs adjacent to the second gate stack structure GST2 among the first cell plugs CP1 included in the first gate stack structure GST1 and first cell plugs adjacent to the first gate stack structure GST1 among the first cell plugs CP1 included in the second gate stack structure GST2 may be disposed to be spaced apart from each other at a second distance d2. The second distance d2 may be longer than the first distance d1.

The plurality of first cell plugs CP1 and the plurality of second cell plugs CP2, which are included in each of the first gate stack structure GST1 and the second gate stack structure GST2, may have the same structure as those shown in FIG. 5B.

FIGS. 13A, 13B, 14, 15A, 15B, and 16 are views illustrating a process of forming a gate stack structure in accordance with another embodiment of the present disclosure.

FIG. 13A is a sectional view of a stack structure taken along line C-C' shown in FIG. 12. The line C-C' may be a boundary region of the first gate stack structure GST1 and the second gate stack structure GST2.

Figure 13B:
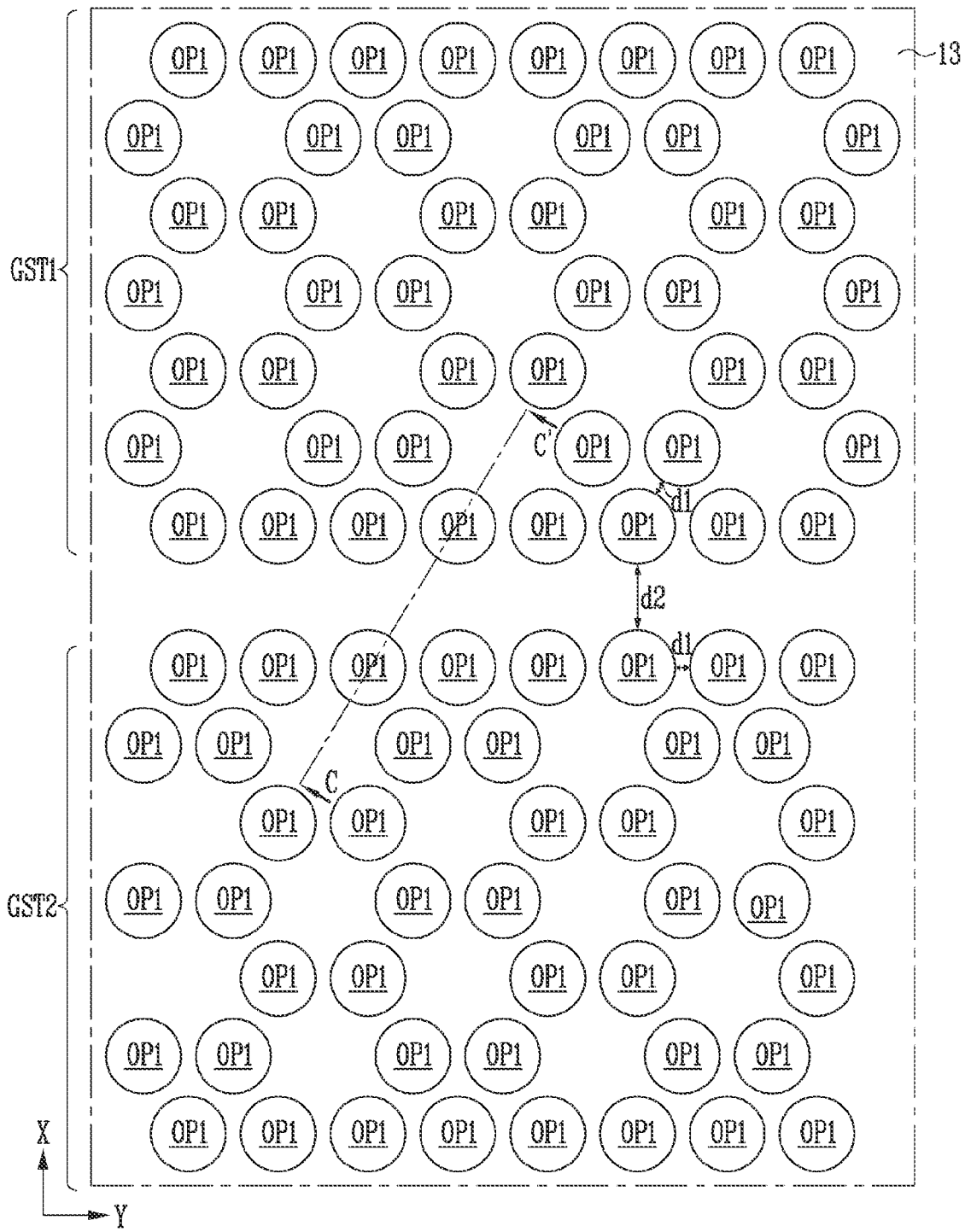

Referring to FIGS. 13A and 13B, a stack structure ST may be formed, in which sacrificial layers 11 and interlayer insulating layers 12 are alternately stacked. The stack structure ST may be formed on a substrate (not shown) including a peripheral circuit.

The sacrificial layers 11 may be formed of a material different from that of the interlayer insulating layers 12. For example, the interlayer insulating layers 12 may be formed of oxide such as silicon oxide. The sacrificial layers 11 may be formed of a material having an etching rate different from that of the interlayer insulating layers 12. For example, the sacrificial layers 11 may be formed of nitride such as silicon nitride.

Subsequently, a first hard mask pattern 13 in which regions OP1 in which first cell plugs are to be formed are opened is formed on the stack structure ST.

For example, in the first hard mask pattern 13, regions OP1 in which six first cell plugs are to be formed may be disposed along one circle. The regions OP1 in which six first cell plugs are to be formed may be formed to be spaced apart from each other at a certain distance.

As shown in FIG. 13B, regions OP1 in which first cell plugs are to be formed, which are formed on the first gate stack structure GST1, may be disposed to be spaced apart from each other at a first distance d1, and regions OP1 in which first cell plugs are to be formed, which are formed on the second gate stack structure GST2, may be disposed to be spaced apart from each other at a first distance d1. In addition, regions OP1 in which first cell plugs are to be formed, which are adjacent to the second gate stack structure GST2, among the regions OP1 in which the first cell plugs are to be formed on the first gate stack structure GST1 and regions OP1 in which first cell plugs are to be formed, which are adjacent to the first gate stack structure GST1, among the regions OP1 in which the first cell plugs are to be formed on the second gate stack structure GST2 may be disposed to be spaced apart from each other at a second distance d2. The second distance d2 may be longer than the first distance d1.

Figure 14:
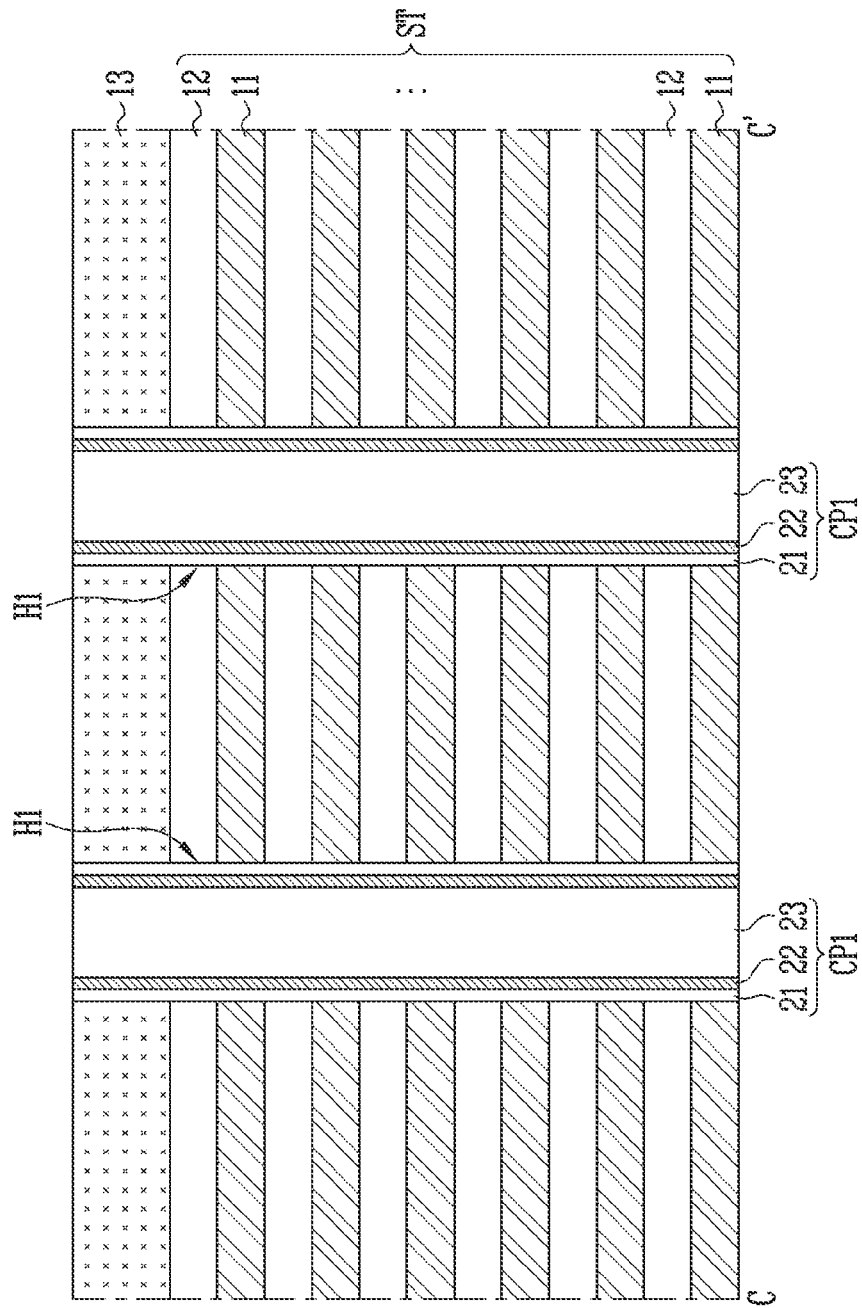

Referring to FIG. 14, a plurality of first holes H1 penetrating the stack structure ST are formed by performing an etching process using the first hard mask pattern 13. Subsequently, first cell plugs CP1 are formed in the first holes H1. The first cell plugs CP1 may be formed by sequentially stacking a memory layer 21, a channel layer 22, and a core insulating layer 23 on sidewalls of the first holes H1.

The memory layer 21 may be formed as a multi-layer. For example, the memory layer 21 may include a blocking insulating layer, a charge storage layer, and a tunnel insulating layer. The blocking insulating layer may be formed on the sidewalls of the first holes H1. The blocking insulating layer may include an oxide layer capable of blocking charges. In an embodiment, the blocking insulating layer may be formed of $Al_2O_3$. The charge storage layer may be formed on a sidewall of the blocking insulating layer. The charge storage layer may be formed as a charge trap layer, be formed as a material layer including a conductive nano dot, or be formed as a phase change material layer. For example, the charge storage layer may store data changed using Fowler-Nordheim tunneling. To this end, the charge storage layer may be formed as a silicon nitride layer in which charges can be trapped. The tunnel insulating layer may be formed on a sideman of the charge storage layer. The tunnel insulating layer may be formed as a silicon oxide layer through which charges can tunnel.

The channel layer 22 may include a semiconductor layer. In an embodiment, the channel layer 22 may include silicon.

The core insulating layer 23 may be formed by filling central regions of the first holes H1. The core insulating layer may be formed as an oxide layer.

Figure 15A:
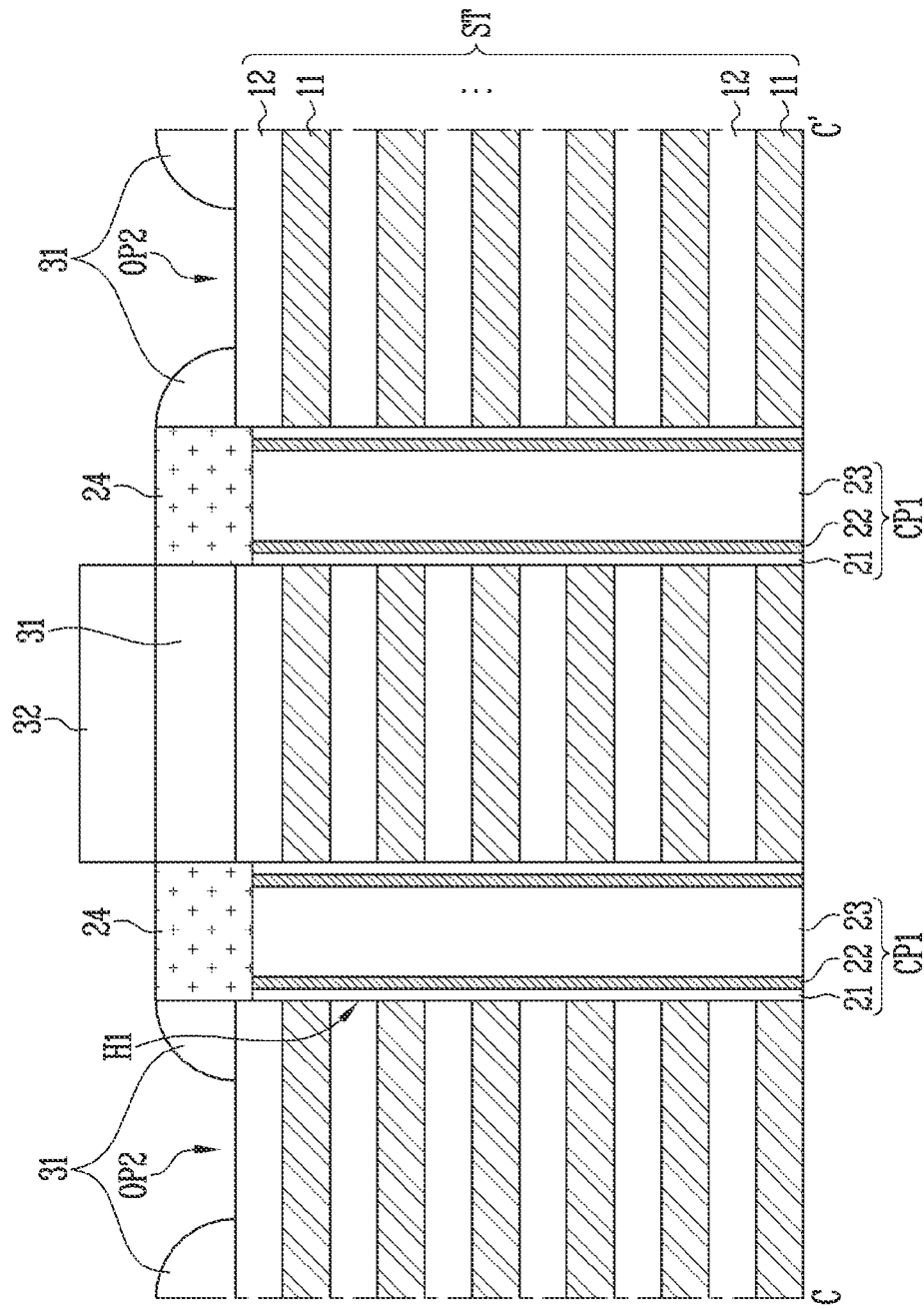
Figure 15B:
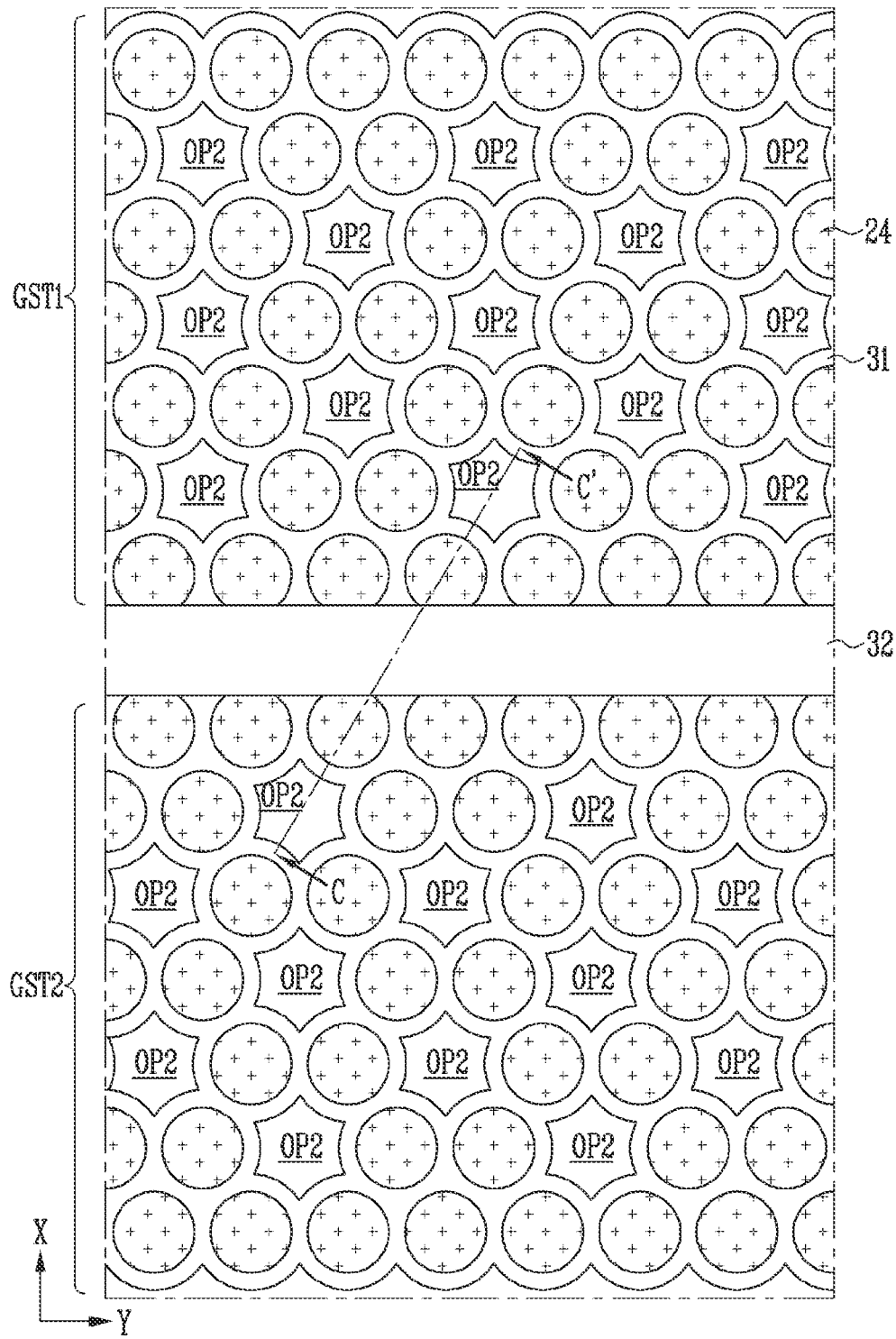

Referring to FIGS. 15A and 15B, upper portions of the first cell plugs CP1 may be etched by a certain thickness. For example, the upper portions of the first cell plugs CP1 may be etched by the certain thickness such that an upper surface of the first cell plugs CP1 is higher than that of the sacrificial layer 11 locate at an uppermost portion and is lower than that of the interlayer insulating layer 12 located at an uppermost portion.

Subsequently, a first contact plug pattern 24 may be formed in spaces in which the first cell plugs CP1 are etched and removed. In an embodiment, the first contact plug pattern 24 may be formed as a doped semiconductor layer.

Subsequently, the first hard mask pattern is removed. Therefore, the first contact plug pattern 24 further protrudes than the stack structure ST. Subsequently, after a hard mask layer is formed on the entire structure including the protruding first contact plug pattern 24, a protective pattern 32 is formed on the hard mask layer of the boundary region between the first gate stack structure GST1 and the second gate stack structure GST2. Subsequently, a second hard mask pattern 31 is formed by allowing the hard mask layer to remain on a sidewall of the first contact plug pattern 24 through an etching process. Therefore, etching of the boundary region between the first gate stack structure GST1 and the second gate stack structure GST2 is prevented by the protective pattern 32.

A method of forming the second hard mask pattern 31 will be described as follows.

A hard mask layer is formed on the entire structure including the protruding first contact plug pattern 24, and the protective pattern 32 is formed on the hard mask layer of the boundary region between the first gate stack structure GST1 and the second gate stack structure GST2. Subsequently, the second hard mask pattern 31 is formed on the sidewall of the protruding first contact plug pattern 24 by entirely etching the hard mask layer. As an entire etching process result, the hard mask layer remains on the sidewall of the protruding first contact plug patter 24, and accordingly, an upper surface of the first contact plug pattern 24 and a portion of the stack structure ST between the first cell plugs CP1 are exposed. That is, a region OP2 in which a second cell plug is to be formed is opened between the first cell plugs CP1. The region OP2 in which the second cell plug is to be formed may be defined in a hexagonal shape as shown in FIG. 15B. That is, an open region having a hexagonal shape is defined in a central region of six first cell plugs CP1 disposed in a circular shape.

Subsequently, the protective pattern 32 may be removed.

Figure 16:
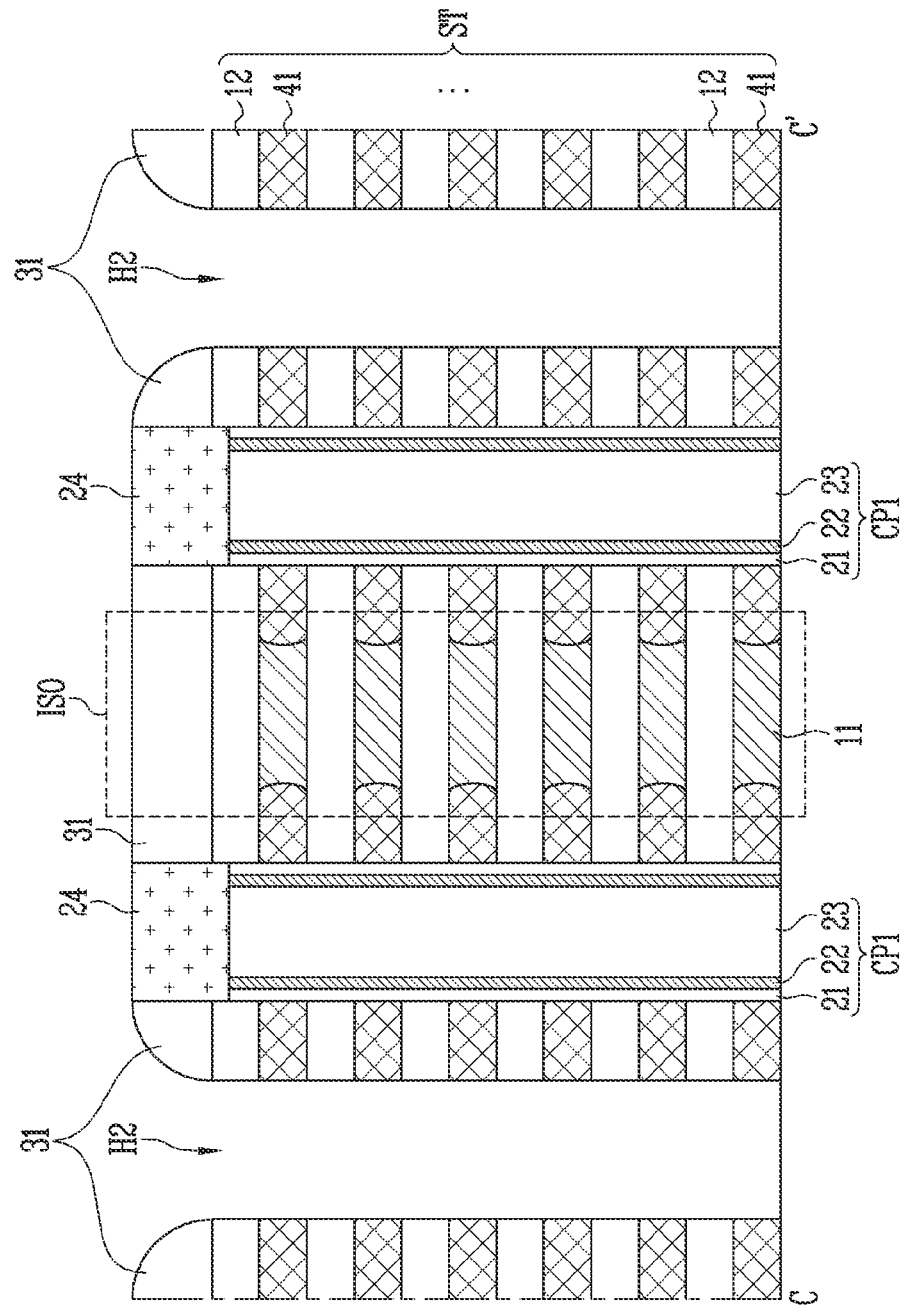

Referring to FIG. 16, a second hole H2 penetrating the stack structure ST is formed by performing an etching process using, as an etch mask, the second hard mask pattern 31 and the first contact plug pattern 24. That is, the second hole H2 is formed by etching the stack structure ST of a region in which a second cell plug is to be formed. Sidewalls of the sacrificial layers are exposed by the second hole H2.

The sacrificial layers exposed through the second hole H2 are removed. The sacrificial layer 11 formed in the boundary region between the first gate stack structure and the second gate stack structure remains by controlling a condition such as an etching time in an etching process for removing the sacrificial layers. That is, the sacrificial layer in the region of the first gate stack structure and the sacrificial layer in the region of the second gate stack structure are removed, and the sacrificial layer 11 of the boundary region between the first gate stack structure and the second gate stack structure remains. The region between the first gate stack structure and the second gate stack structure may be defined as an isolation region ISO.

Subsequently, plate electrodes 41 are formed by filling a conductive material in spaces in which the sacrificial layers are removed. The plate electrodes 41 are electrically isolated from each other by the sacrificial layer 11 remaining in the boundary region between the first gate stack structure and the second gate stack structure.

Subsequently, a second cell plug CP2 may be formed in the second hole H2 as described above in FIG. 10.

Figure 17:
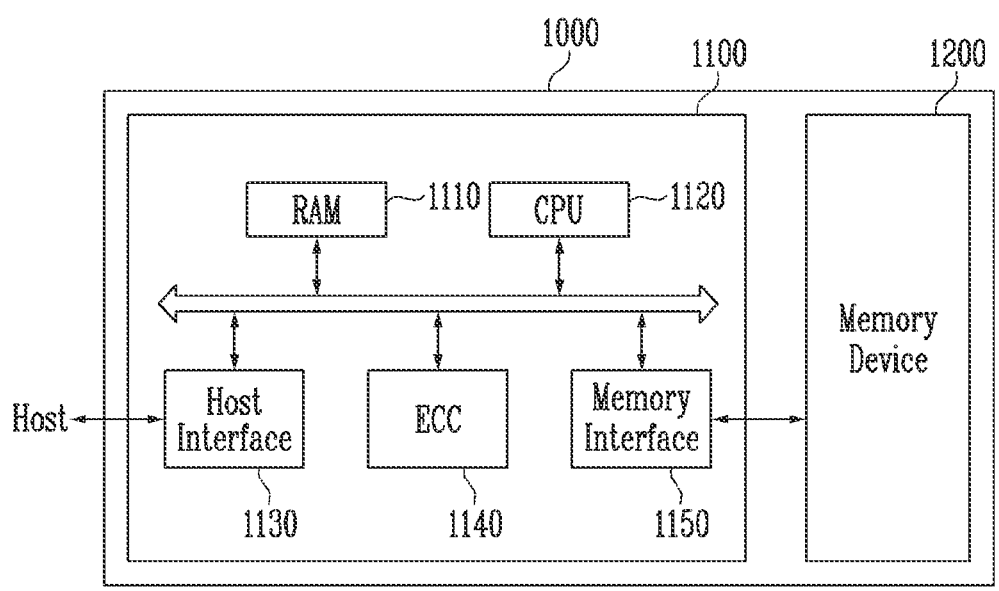
FIG. 17 is a block diagram illustrating a configuration of a memory system in accordance with an embodiment of the present disclosure.

FIG. 17 is a block diagram illustrating a configuration of a memory system in accordance with an embodiment of the present disclosure.

Referring to FIG. 17, the memory system 1000 in accordance with the embodiment of the present disclosure includes a memory device 1200 and a controller 1100.

The memory device 1200 is used to store data information having various data formats such as texts, graphics, and software codes. The memory device 1200 may be a nonvolatile memory, and be manufactured according to the manufacturing method of the memory device described with reference to FIGS. 6A, 6B, 7, 8A, 8B, 8C, 9, and 10 or the manufacturing method of the memory device described with reference to FIGS. 13A, 13B, 14, 15A, 15B, and 16. A structure and a manufacturing method of the memory device 1200 are the same as described above, and therefore, detailed descriptions will be omitted.

The controller 1100 is connected to a host and the memory device 1200, and accesses the memory device 1200 in response to a request from the host. For example, the controller 1100 controls reading, writing, erasing, and background operations of the memory device 1200.

The controller 1100 includes a random access memory (RAM) 1110, a central processing unit (CPU) 1120, a host interface 1130, an error correction code (ECC) circuit 1140, a memory interface 1150, and the like.

The RAM 1110 may be used as a working memory of the CPU 1120, a cache memory between the memory device 1200 and the host, and a buffer memory between the memory device 1200 and the host. The RAM 1110 may be replaced with a static random access memory (SRAM), a read only memory (ROM), etc, The CPU 1120 controls overall operations of the controller 1100. For example, the CPU 1120 is configured to operate firmware such as a flash translation layer (FTL) stored in the RAM 1110.

The host interface 1130 is configured to interface with the host. For example, the controller 1100 communicates with the host using at least one of a variety of interface protocols, such as a universal serial bus (USB) protocol, a multimedia card (MMC) protocol, a peripheral component interconnection (PCI) protocol, a PCI-Express (PCI-E) protocol, an advanced technology attachment (ATA) protocol, a Serial-ATA protocol, a Parallel-ATA protocol, a small computer system interface (SCSI) protocol, an enhanced small disk interface (ESDI) protocol, an integrated drive electronics (IDE) protocol, and a private protocol.

The ECC circuit 1140 is configured to detect and correct an error included in data that is read from the memory device 1200, using an error correction code (ECC).

The memory interface 1150 may be configured to interface with the memory device 1200. For example, the memory interface 1150 includes an NAND interface or NOR interface.

The controller 1100 may further include a buffer memory (not shown) for temporarily storing data. The buffer memory may be used to temporarily store data transferred to the outside through the host interface 1130 or data transferred from the memory device 1200 through the memory interface 1150. The controller 1100 may further include a ROM that stores code data for interfacing with the host.

As described above, the memory system 1000 in accordance with the embodiment of the present disclosure includes the memory device 1200 having an improved degree of integration and improved characteristics, and thus the degree of integration and characteristics of the memory system 1000 can be improved.

Figure 18:
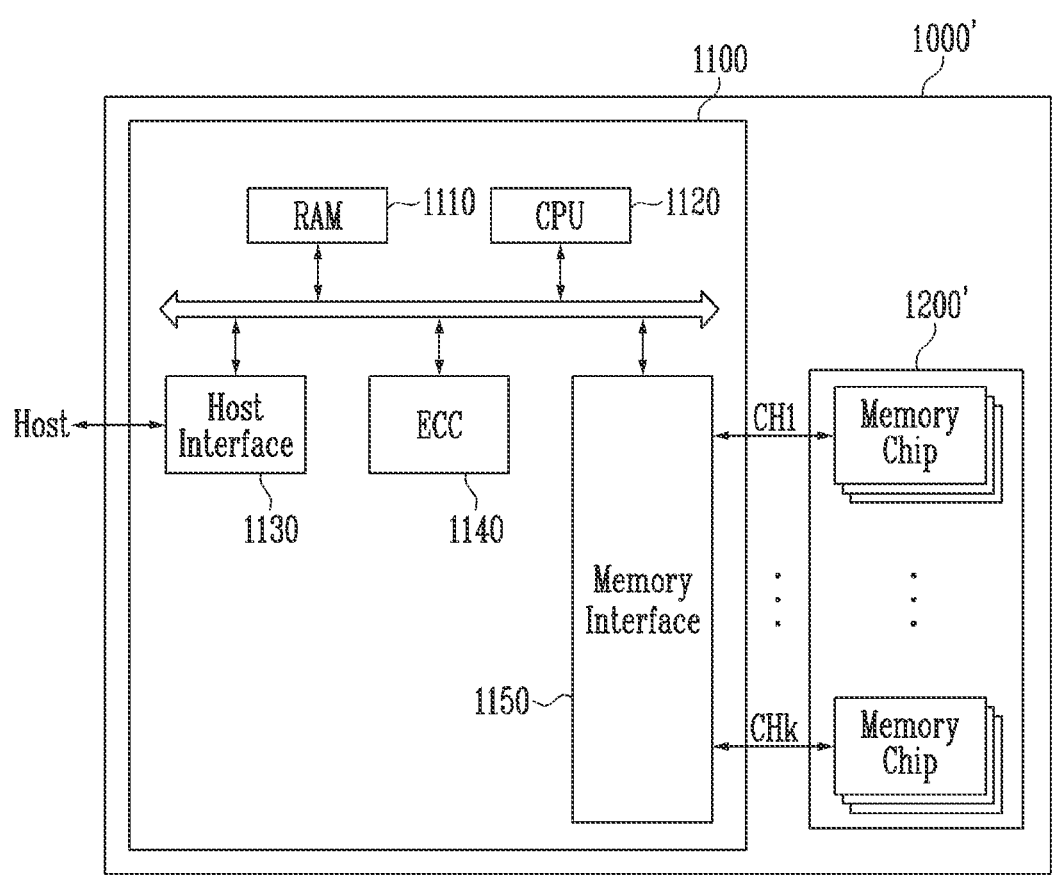
FIG. 18 is a block diagram illustrating a configuration of a memory system in accordance with an embodiment of the present disclosure.

FIG. 18 is a block diagram illustrating a configuration of a memory system in accordance with an embodiment of the present disclosure. Hereinafter, descriptions of portions overlapping with those described above will be omitted.

Referring to FIG. 18, the memory system 1000' in accordance with the embodiment of the present disclosure includes a memory device 1200' and a controller 1100. The controller 1100 includes a RAM 1110, a CPU 1120, a host interface 1130, an ECC circuit 1140, a memory interface 1150, and the like.

The memory device 1200' may be a nonvolatile memory, and be manufactured according to the manufacturing method of the memory device described with reference to FIGS. 6A, 6B, 7, 8A, 8B, 8C, 9, and 10 or the manufacturing method of the memory device described with reference to FIGS. 13A, 13B, 14, 15A, 15B, and 16. A structure and a manufacturing method of the memory device 1200' are the same as described above, and therefore, detailed descriptions will be omitted.

The memory device 1200' may be a multi-chip package including a plurality of memory chips. The plurality of memory chips are divided into a plurality of groups, which are configured to communicate with the controller 1100 over first to kth channels (CH1 to CHk). In addition, memory chips included in one group may be configured to communicate with the controller 1100 over a common channel. For reference, the memory system 1000' may be modified such that one memory chip is connected to one channel.

As described above, the memory system 1000' in accordance with the embodiment of the present disclosure includes the memory device 1200' having an improved degree of integration and improved characteristics, and thus the degree of integration and characteristics of the memory system 1000' can be improved. Particularly, the memory device 1200' is configured as a multi-chip package, so that the data storage capacity of the memory system 1000' can be increased, and the operation speed of the memory system 1000' can be improved.

Figure 19:
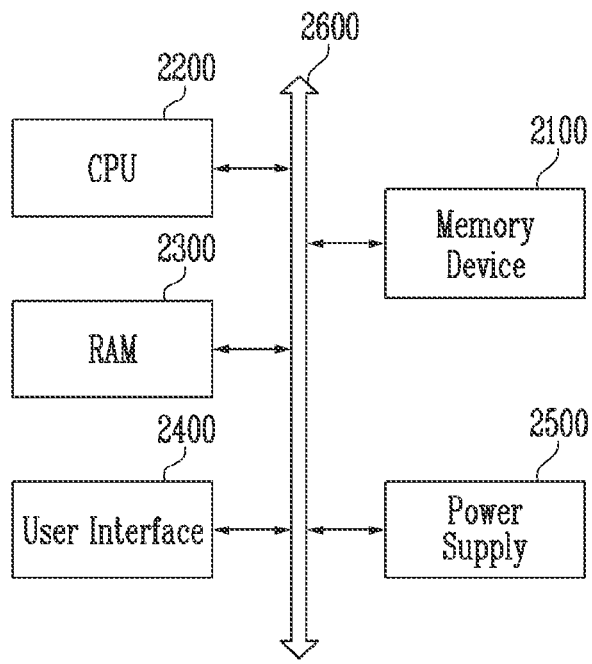
FIG. 19 is a block diagram illustrating a configuration of a computing system in accordance with an embodiment of the present disclosure.

FIG. 19 is a block diagram illustrating a configuration of a computing system in accordance with an embodiment of the present disclosure. Hereinafter, descriptions of portions overlapping with those described above will be omitted.

Referring to FIG. 19, the computing system 2000 in accordance with the embodiment of the present disclosure includes a memory device 2100, a CPU 2200, a RAM 2300, a user interface 2400, a power supply 2500, a system bus 2600, and the like.

The memory device 2100 stores data provided through the user interface 2400, data processed by the CPU 2200, and the like. In addition, the memory device 2100 is electrically connected to the CPU 2200, the RAM 2300, the user interface 2400, the power supply 2500, and the like through the system bus 2600. For example, the memory device 2100 may be connected to the system bus 2600 through a controller (not shown) or directly. When the memory device 2100 is directly connected to the system bus 2600, a function of the controller may be performed by the CPU 2200, the RAM 2300, etc.

The memory device 2100 may be a nonvolatile memory, and be manufactured according to the manufacturing method of the memory device described with reference to FIGS. 6A, 6B, 7, 8A, 8B, 8C, 9, and 10 or the manufacturing method of the memory device described with reference to FIGS. 13A, 13B, 14, 15A, 15B, and 16. A structure and a manufacturing method of the memory device 2100 are the same as described above, and therefore, detailed descriptions will be omitted.

The memory device 2100 may be a multi-chip package including a plurality of memory chips as described with reference to FIG. 18.

The computing system 2000 configured as described above may be a computer, an ultra-mobile PC (UMPC), a workstation, a netbook, a personal digital assistant (PDA), a portable computer; a web tablet, a wireless phone, a mobile phone, a smartphone, an e-book, a portable multimedia player (PMP), a portable game console, a navigation device, a black box, a digital camera, a 3-dimensional television, a digital audio recorder; a digital audio player, a digital picture recorder, a digital picture player, a digital video recorder, a digital video player, a device for communicating information in a wireless environment, one of a variety of electronic devices constituting a home network, one of a variety of electronic devices constituting a computer network, one of a variety of electronic devices constituting a telematics network, an RFID device, etc.

As described above, the computing system 2000 in accordance with the embodiment of the present disclosure includes the memory device 2100 having an improved degree of integration and improved characteristics, and thus characteristics of the computing system 2000 can also be improved.

Figure 20:
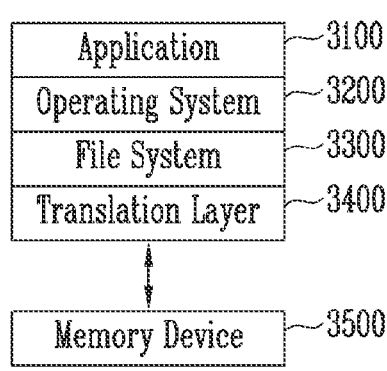
FIG. 20 is a block diagram illustrating a configuration of a computing system in accordance with an embodiment of the present disclosure.

FIG. 20 is a block diagram illustrating a configuration of a computing system in accordance with an embodiment of the present disclosure.

Referring to FIG. 20, the computing system 3000 in accordance with the embodiment of the present disclosure includes a software layer including an operating system 3200, an application 3100, a file system 3300, a translation layer 3400, and the like. In addition, the computing system 3000 includes a hardware layer of a memory device 3500, etc.

The operating system 3200 may manage software resources, hardware resources, etc. of the computing system 3000, and control program execution of a central processing unit. The application 3100 is one of a variety of application programs running on the computing system 3000, and may be a utility executed by the operating system 3200.

The file system 3300 means a logical structure for managing data, files, etc. in the computing system 3000, and organizes the data or files stored in the memory device 3500 according to a rule. The file system 3300 may be determined depending on the operating system 3200 used in the computing system 3000. For example, when the operating system 3200 is one of Windows operating systems of Microsoft, the file system 3300 may be a file allocation table (FAT) or a NT file system (NTFS). When the operating system 3200 is one of Unix/Linux operating systems, the file system 3300 may be an extended file system (EXT), a Unix file system (UFS), or a journaling file system (JFS).

In this drawing, the operating system 3200, the application 3100, and the file system 3300 are shown as individual blocks. However, the application 3100 and the file system 3300 may be included in the operating system 3200.

The translation layer 3400 translates an address into a form suitable for the memory device 3500 in response to a request from the file system 3300. For example, the translation layer 3400 translates a logical address generated by the file system 3300 into a physical address of the memory device 3500. Mapping information between the logical address and the physical address may be stored as an address translation table. For example, the translation layer 3400 may be a flash translation layer (FTL), a universal flash storage link layer (ULL), etc.

The memory device 3500 may be a nonvolatile memory, and be manufactured according to the manufacturing method of the memory device described with reference to FIGS. 6A, 6B, 7, 8A, 8B, 8C, 9, and 10 or the manufacturing method of the memory device described with reference to FIGS. 13A, 13B, 14, 15A, 15B, and 16. A structure and a manufacturing method of the memory device 3500 are the same as described above, and therefore, detailed descriptions will be omitted.

The computing system 3000 configured as described above may be divided into an operating system layer performed in an upper level region and a controller layer performed in a lower level region. The application 3100, the operating system 3200, and the file system 3300 are included in the operating system layer, and may be driven by a working memory of the computing system 3000. In addition, the translation layer 3400 may be included in the operating system layer or the controller layer.

As described above, the computing system 3000 in accordance with the embodiment of the present disclosure includes the memory device 3500 having an improved degree of integration and improved characteristics, and thus characteristics of the computing system 3000 can also be improved.

In accordance with the present disclosure, holes are formed in a space between first cell plugs, so that a process of forming a gate conductive pattern can be more easily performed. Further, second cell plugs are formed in the holes, so that the degree of integration of the memory device can be improved.

While the present disclosure has been shown and described with reference to certain examples of embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described examples of embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the examples of embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A method of manufacturing a memory device, the method comprising:
    forming a stack structure in which a plurality of sacrificial layers and a plurality of interlayer insulating layers are alternately stacked;
    forming a plurality of first cell plugs penetrating the stack structure;
    forming first contact plug patterns on the tops of the plurality of first cell plugs;
    opening upper portions of the stack structure in regions in which a plurality of second cell plugs are to be formed by forming a hard mask pattern on sidewalls of the first contact plug patterns;
    forming holes penetrating the stack structure by performing an etching process using the hard mask pattern and the first contact plug patterns;
    removing the plurality of sacrificial layers exposed through the holes, and forming a plurality of plate electrodes by filling a conductive layer in spaces in which the plurality of sacrificial layers are removed; and
    forming the plurality of second cell plugs in the holes.

2. The method of claim 1,
    wherein, in the forming of the plurality of first cell plugs, six first cell plugs are formed substantially along a circle and each of the six first cell plugs is spaced apart from an adjacent first cell plug among the six first cell plugs at a certain distance.

3. The method of claim 2,
    wherein, in the opening of the upper portions of the stack structure in the regions in which the plurality of second cell plugs are to be formed, a center region of the six first cell plugs disposed in substantially a circular shape is opened in substantially a hexagonal shape.

4. The method of claim 3,
    wherein the holes are formed in substantially a hexagonal prism shape.

5. The method of claim 4, wherein the forming of the plurality of second cell plugs includes:
    sequentially forming a memory layer and a channel layer on sidewalls of the holes having substantially the hexagonal prism shape; and
    filling central regions of the holes with a core insulating layer.

6. The method of claim 5, wherein the forming of the memory layer includes:
    forming a blocking insulating layer by depositing a nitride layer on the sidewalls of the holes having substantially the hexagonal prism shape and then oxidizing the nitride layer; and
    sequentially forming a charge storage layer and a tunnel insulating layer on a sidewall of the blocking insulating layer,
    wherein the blocking insulating layer has substantially a hexagonal horizontal shape, and the charge storage layer and the tunnel insulating layer have substantially a circular horizontal shape.

7. The method of claim 1, wherein the forming of the hard mask pattern on the sidewalls of the first contact plug patterns includes:
    forming a hard mask layer on the top of the entire structure including the first contact plugs; and
    forming the hard mask pattern by allowing the hard mask layer to remain on only the sidewalls of the first contact plugs through an entire surface etching process.

8. The method of claim 1,
    wherein, in the forming of the plurality of first cell plugs, after substantially circular holes penetrating the stack structure are formed, the plurality of first cell plugs having substantially a cylindrical shape are formed in the substantially circular holes.

9. The method of claim 1,
    wherein the plurality of second cell plugs have substantially a hexagonal prism structure.

10. A method of manufacturing a memory device, the method comprising:
    forming a stack structure in which a plurality of sacrificial layers and a plurality of interlayer insulating layers are alternately stacked;
    forming a plurality of first cell plugs penetrating the stack structure, wherein six of the first cell plugs among the plurality of first cell plugs are formed substantially along a circle and each of the six first cell plugs is spaced apart from an adjacent first cell plug among the six of the first cell plugs at a certain distance;

forming first contact plug patterns on the tops of the plurality of first cell plugs;

defining a region in which an upper portion of the stack structure is opened in substantially a hexagonal shape in a central region of the circle by forming a hard mask pattern on sidewalls of the first contact plug patterns;

forming holes having substantially a hexagonal prism shape, which penetrate the stack structure, by etching the stack structure of the opened region;

forming a plurality of plate electrodes by removing the plurality of sacrificial layers exposed through the holes and filling a conductive layer in spaces in which the plurality of sacrificial layers are removed; and forming a plurality of second cell plugs in the holes.

11. The method of claim 10, wherein the forming of the plurality of second cell plugs includes:

sequentially forming a memory layer and a channel layer on sidewalls of the holes having substantially the hexagonal prism shape; and filling central regions of the holes with a core insulating layer.

12. The method of claim 11, wherein the forming of the memory layer includes:

forming a blocking insulating layer by depositing a nitride layer on the sidewalls of the holes having substantially the hexagonal prism shape and then oxidizing the nitride layer; and sequentially forming a charge storage layer and a tunnel insulating layer on a sidewall of the blocking insulating layer.

13. The method of claim 12, wherein the blocking insulating layer has substantially a hexagonal horizontal shape, and the charge storage layer and the tunnel insulating layer have substantially a circular horizontal shape.

14. The method of claim 10, wherein the forming of the hard mask pattern on the sidewalls of the first contact plug patterns includes:

forming a hard mask layer on the top of the entire structure including the first contact plugs; and forming the hard mask pattern by allowing the hard mask layer to remain on only the sidewalls of the first contact plugs through an entire surface etching process.

15. A method of manufacturing a memory device, the method comprising:

forming a stack structure on a substrate region including a first gate stack structure region and a second gate stack structure region, wherein the stack structure includes a plurality of sacrificial layers and a plurality of interlayer insulating layers, which are alternately stacked;

forming a plurality of first cell plugs penetrating the stack structure in the first gate stack structure region and the second gate stack structure region, wherein six first cell plugs among the plurality of first cell plugs are formed substantially along a circle and each of the six first cell plugs is spaced apart from an adjacent first cell plug among the six first cell plugs at a certain distance;

forming first contact plug patterns on the tops of the plurality of first cell plugs;

defining a region in which an upper portion of the stack structure is opened in substantially a hexagonal shape in a central region of the circle by forming a hard mask pattern on sidewalls of the first contact plug patterns;

forming holes having substantially a hexagonal prism shape, which penetrate the stack structure, by etching the stack structure of the opened region;

removing the plurality of sacrificial layers exposed through the holes, wherein the plurality of sacrificial layers remain in a boundary region between the first gate stack structure region and the second gate stack structure region;

forming a plurality of plate electrodes by filling a conductive layer in spaces in which the plurality of sacrificial layers are removed in the first gate stack structure region and spaces in which the plurality of sacrificial layer are removed in the second gate stack structure region; and forming a plurality of second cell plugs in the holes.

16. The method of claim 15, wherein the forming of the memory layer includes:

forming a blocking insulating layer by depositing a nitride layer on the sidewalls of the holes having substantially the hexagonal prism shape and then oxidizing the nitride layer; and sequentially forming a charge storage layer and a tunnel insulating layer on a sidewall of the blocking insulating layer.

17. The method of claim 16, wherein the blocking insulating layer has substantially a hexagonal horizontal shape, and the charge storage layer and the tunnel insulating layer have substantially a circular horizontal shape.

18. The method of claim 15, wherein the forming of the hard mask pattern on the sidewalls of the first contact plug patterns includes:

forming a hard mask layer on the top of the entire structure including the first contact plugs; and forming the hard mask pattern by allowing the hard mask layer to remain on only the sidewalls of the first contact plugs through an entire surface etching process.

19. The method of claim 15, wherein the plurality of plate electrodes of the first gate stack structure and the plurality of plate electrodes of the second gate stack structure are electrically isolated from each other by the plurality of sacrificial layers remaining in the boundary region between the first gate stack structure region and the second gate stack structure region.

* * * * *